(12) United States Patent
Moon

(10) Patent No.: US 7,712,070 B2
(45) Date of Patent: May 4, 2010

(54) METHOD FOR TRANSFERRING SELF-ASSEMBLED DUMMY PATTERN TO SUBSTRATE

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 523 days.

(21) Appl. No.: 11/618,775

(22) Filed: Dec. 30, 2006

(65) Prior Publication Data

US 2008/0124906 A1 May 29, 2008

(30) Foreign Application Priority Data

Nov. 24, 2006 (KR) .................. 10-2006-0117158

(51) Int. Cl.
*G06F 17/50* (2006.01)
*G03F 1/00* (2006.01)
*G03C 5/00* (2006.01)

(52) U.S. Cl. ................. 716/21; 716/19; 716/20; 430/5; 430/30

(58) Field of Classification Search ......... 716/19–21; 438/584, 692, 710; 430/5, 30
See application file for complete search history.

(56) References Cited

U.S. PATENT DOCUMENTS

| | | | | |
|---|---|---|---|---|
| 5,736,300 | A * | 4/1998 | Mizuno et al. | 430/313 |
| 5,790,417 | A * | 8/1998 | Chao et al. | 716/21 |
| 6,259,115 | B1 | 7/2001 | You et al. | |
| 6,266,110 | B1 * | 7/2001 | Mizuno et al. | 349/111 |
| 6,613,688 | B1 * | 9/2003 | Brown et al. | 438/710 |
| 7,153,728 | B2 * | 12/2006 | Morita | 438/129 |
| 7,234,130 | B2 * | 6/2007 | Word et al. | 716/21 |
| 7,482,661 | B2 * | 1/2009 | Kotani et al. | 257/401 |
| 7,530,049 | B2 * | 5/2009 | Kobayashi et al. | 716/19 |
| 7,552,416 | B2 * | 6/2009 | Granik et al. | 716/19 |
| 2003/0001155 | A1 | 1/2003 | Kotani et al. | |
| 2005/0196684 | A1 | 9/2005 | Nakamura et al. | |
| 2005/0196689 | A1 * | 9/2005 | Nolscher et al. | 430/30 |
| 2005/0219992 | A1 * | 10/2005 | Takeda et al. | 369/275.1 |
| 2006/0093926 | A1 | 5/2006 | Fujisawa et al. | |
| 2007/0032083 | A1 * | 2/2007 | Choi | 438/692 |
| 2007/0178389 | A1 * | 8/2007 | Yoo | 430/5 |

FOREIGN PATENT DOCUMENTS

| | | |
|---|---|---|
| JP | 06-095356 | 4/1994 |
| JP | 09-288347 | 11/1997 |
| JP | 2000-112114 | 4/2000 |
| JP | 2001-125252 | 5/2001 |
| JP | 2003248296 A * | 9/2003 |
| JP | 2004-341064 | 12/2004 |
| JP | 2005-141104 | 6/2005 |
| KR | 10-1997-0018401 | 4/1997 |
| KR | 100217903 B1 | 6/1999 |

* cited by examiner

*Primary Examiner*—Helen Rossoshek
(74) *Attorney, Agent, or Firm*—Townsend and Townsend and Crew LLP

(57) ABSTRACT

A semiconductor device fabrication method is disclosed. The method includes obtaining an inverse layout of an original circuit layout, reducing the inverse layout in size, thereby obtaining a reduced layout, obtaining a dummy pattern layout having an outline identical to an outline of the reduced layout and a given line width such that the dummy pattern layout is self-assembled to the circuit layout, and transferring the self-aligned or self-assembled dummy pattern layout and circuit layout to a semiconductor substrate.

8 Claims, 26 Drawing Sheets

METHOD FOR TRANSFERRING SELF-ASSEMBLED DUMMY PATTERN TO SUBSTRATE

CROSS-REFERENCES TO RELATED APPLICATIONS

The present application claims priority to Korean patent application number 10-2006-117158, filed on Nov. 24, 2006, which is incorporated herein by reference in its entirety.

BACKGROUND OF THE INVENTION

The present invention relates to transferring to patterns a substrate, e.g., a semiconductor substrate.

For semiconductor devices or integrated circuit devices having a high degree of integration, extensive research has been made into developing schemes for improving device characteristics and securing an increased process margin. For example, semiconductor devices such as NAND type flash memory devices or DRAM memory devices have been developed to increase memory capacity and reduce the critical dimension (CD) of patterns making up such a device. For this reason, there are various limitations or problems associated with a micro lithography process, an etch process, and a chemical mechanical polishing (CMP) process required for the formation of patterns that make up a device on a wafer.

For example, pattern defects may occur in a light exposure process using micro lithography due to a reduction in pattern size. Examples of such pattern defects are; a pattern bridge, a phenomenon where patterns are undesirably connected; or a pattern necking, a phenomenon where the critical dimensions of a pattern is undesirably reduced, or the patterns are undesirably disconnected. In order to overcome such limitations associated with the processes, various methods have been proposed. For example, a method for changing or modifying a designed pattern layout, and a method for inserting dummy patterns into a designed layout, as assistant patterns.

The shape and function of such a dummy pattern depends on the characteristics of the layer which is required for fabrication of a semiconductor device and to which the dummy pattern is applied. Also, the method for creating such a dummy pattern and inserting the created dummy pattern depends on the designed circuitry layout. When the circuit pattern to be formed on a wafer is a gate pattern of a transistor, the dummy pattern may function as a gate assist pattern for assisting light exposure and etching of the gate pattern. The dummy pattern may be applied as a CMP assist dummy pattern to minimize the differences in polishing rates amongst different parts of a wafer due to the differences in topology of the wafer. In addition, a dummy pattern may be introduced which is capable of overcoming a pattern line width difference between a cell region and a peripheral region, thereby improving the process margin during light exposure and etch processes.

When the circuit pattern to be formed on a wafer is a gate pattern of a transistor, a line-shaped dummy pattern may be inserted as an assistant pattern for improving the process margin around a gate. Also, in the case of a memory device, a block-shaped dummy pattern may be inserted into a large empty area around a gate in a peripheral region. However, there is an increased possibility of a short circuit between the dummy pattern and the circuit pattern (e.g., around the bit line or metal interconnection layer) during the dummy pattern insertion process. As a result, it is difficult to perform the insertion of the dummy pattern in an automatic manner. For this reason, in conventional cases, the dummy pattern insertion is carried out manually.

For the creation of a dummy pattern, a rule dummy creation scheme may be taken into consideration. In this creation scheme the dummy pattern is created depending on rule data (including the dimensions and spacing of given patterns), the shape of the dummy pattern and the dimensions of the dummy pattern. A manual scheme based on the worker's determination may also be taken into consideration. In the rule dummy creation scheme, however, it is difficult to take into consideration parameters associated with the light exposure process. For this reason, there is a high possibility of a bridge between patterns or a collapse of patterns. Furthermore, in the process and design of the peripheral region, there may be unpredictable factors associated with creation and insertion of a dummy pattern unless light exposure conditions are taken into consideration. This is because 2-dimensional patterns are mainly arranged in the peripheral region.

On the other hand, in the manual scheme, it may take a relatively long time for the insertion of a dummy pattern. For example, in the case of a page buffer circuit arranged in a peripheral region of a multi-level cell (MLC) type flash memory device, the page buffer region may have a large width of about 700 μm. This large area would take a considerable amount of time to manually create and insert dummy patterns for the entire region. Furthermore, when dummy patterns are manually created in such a large region, the possibility of human error increases. As a result, it is difficult to obtain a circuit pattern without defects.

Therefore, development of a new dummy pattern insertion method is being required which can take into consideration light exposure process conditions, and thus, can secure stable light exposure process conditions, and can prevent a short circuit between a dummy pattern and a circuit pattern.

BRIEF SUMMARY OF THE INVENTION

In one aspect of the present invention, a method for fabricating a semiconductor device comprises: designing an original circuit layout; obtaining an inverse layout of the circuit layout; reducing the inverse layout in size, thereby obtaining a reduced layout; obtaining a dummy pattern layout having an outline identical to an outline of the reduced layout and a given line width such that the dummy pattern layout is self-assembled to the circuit layout; combining the dummy pattern layout with the circuit layout; and transferring the combined layout to a semiconductor substrate.

The method may further comprise reducing the inverse layout by a reduction width larger than a reduction width of the reduced layout, thereby obtaining a second reduced layout, obtaining a second dummy pattern layout having an outline identical to an outline of the second reduced layout and a given line width such that the second dummy pattern layout is spaced apart from the circuit layout, further than the first dummy pattern, and combining the second dummy pattern layout with the circuit layout.

The method may further comprise transferring the combined layout to a photomask substrate, thereby forming a photomask, and performing a light exposure process using the photomask, thereby transferring the combined layout to the semiconductor substrate.

The photomask may comprise a binary mask or a phase shift mask having the combined layout transferred to the mask.

In another aspect of the present invention, a method for fabricating a semiconductor device comprises designing an original circuit layout; obtaining an inverse layout of the circuit layout; reducing the inverse layout by a first reduction width, thereby obtaining a first reduced layout; reducing the first reduced layout by a second reduction width, thereby obtaining a second reduced layout; deducting the second reduced layout from the first reduced layout, thereby obtaining a dummy pattern layout self-assembled to the circuit layout; combining the dummy pattern layout with the circuit layout; and transferring the combined layout to a semiconductor substrate.

In another aspect of the present invention, a method for fabricating a semiconductor device comprises: designing an original circuit layout; setting light exposure conditions to be used for transfer of the circuit layout; obtaining an inverse layout of the circuit layout; reducing the inverse layout in an X-axis direction by a first reduction width set after reflecting the light exposure conditions in association with the X-axis direction, thereby obtaining a first reduced layout; reducing the first reduced layout in a Y-axis direction by a second reduction width set after reflecting the light exposure conditions in association with the Y-axis direction, thereby obtaining a second reduced layout; reducing the second reduced layout by a third reduction width in the X-axis direction and by a fourth reduction width in the Y-axis direction, thereby obtaining a third reduced layout; deducting the third reduced layout from the second reduced layout, thereby obtaining a dummy pattern layout self-assembled to the circuit layout; combining the dummy pattern layout with the circuit layout; and transferring the combined layout to a semiconductor substrate.

In another embodiment, a method for transferring patterns to a substrate includes designing a circuit layout to be transferred to the substrate; obtaining an inverse layout of the circuit layout; reducing the inverse layout in size, thereby obtaining a reduced layout; obtaining a dummy pattern layout having an outline corresponding to an outline of the reduced layout and a given line width such that the dummy pattern layout is self-assembled to the circuit layout; and combining the dummy pattern layout and the circuit layout. The method further comprises transferring the circuit layer to the substrate. The method further comprises transferring the combined layout to the substrate.

In yet another embodiment, a method for transferring a pattern to a substrate includes designing a circuit layout having a circuit pattern, the circuit pattern defining an open area; obtaining an inverse layout of the circuit layout; reducing the inverse layout by a first reduction width, thereby obtaining a first reduced layout; reducing the first reduced layout by a second reduction width, thereby obtaining a second reduced layout; deducting the second reduced layout from the first reduced layout, thereby obtaining a self-assembled dummy pattern layout; combining the dummy pattern layout and the circuit layout, the dummy pattern layout being defined within an open area defined by the circuit pattern; and transferring the combined layout to a substrate. The substrate to where the combined layout is transferred is a semiconductor substrate. The substrate to where the combined layout is transferred may be a photomask substrate.

DETAILED DESCRIPTION OF THE INVENTION

In an embodiment of the present invention, a method for inserting a self-assembled dummy pattern into a layout of a circuit pattern is proposed. The shape of the dummy pattern is set based on the original layout, so that the dummy pattern is aligned with the original layout. Accordingly, it can be appreciated that the dummy pattern is a self-assembled dummy pattern.

As used herein, the term "self-assembled dummy pattern" refers to a dummy pattern that has been obtained using a computer-implemented algorithm. The computer-implemented algorithm may be based on one or more parameters set by a user based on the light exposure condition, so that such a condition may be taken into account when determining the shape and insertion location of the dummy pattern.

Since the alignment and setting of the dummy pattern are achieved based on the original layout, the light exposure conditions can be taken into account the conditions for setting the shape and insertion position of the dummy pattern when the setting is carried out. Accordingly, it is possible to automatically correct pattern defects, such as pattern bridge or pattern necking, which may be generated in light exposure processes, by automatically correcting the pattern defects in accordance with the applied light exposure conditions.

Since the dummy pattern is set based on the shape of the circuit pattern layout, it is possible to automatically create dummy patterns for circuit layouts having various shapes (e.g., bit lines or metal line layers) using an operating device such as a computer, and to insert the created dummy patterns into the original layout. Accordingly, it is possible to create dummy patterns for a circuit pattern having a complex shape.

Thus, it is possible to achieve an improvement in resolution in light exposure processes and to secure a desired process margin in light exposure processes. This is because it is possible to insert the self-assembled dummy pattern into the original layout, and to transfer the combined pattern to a photomask then to a semiconductor substrate.

Figure 1:
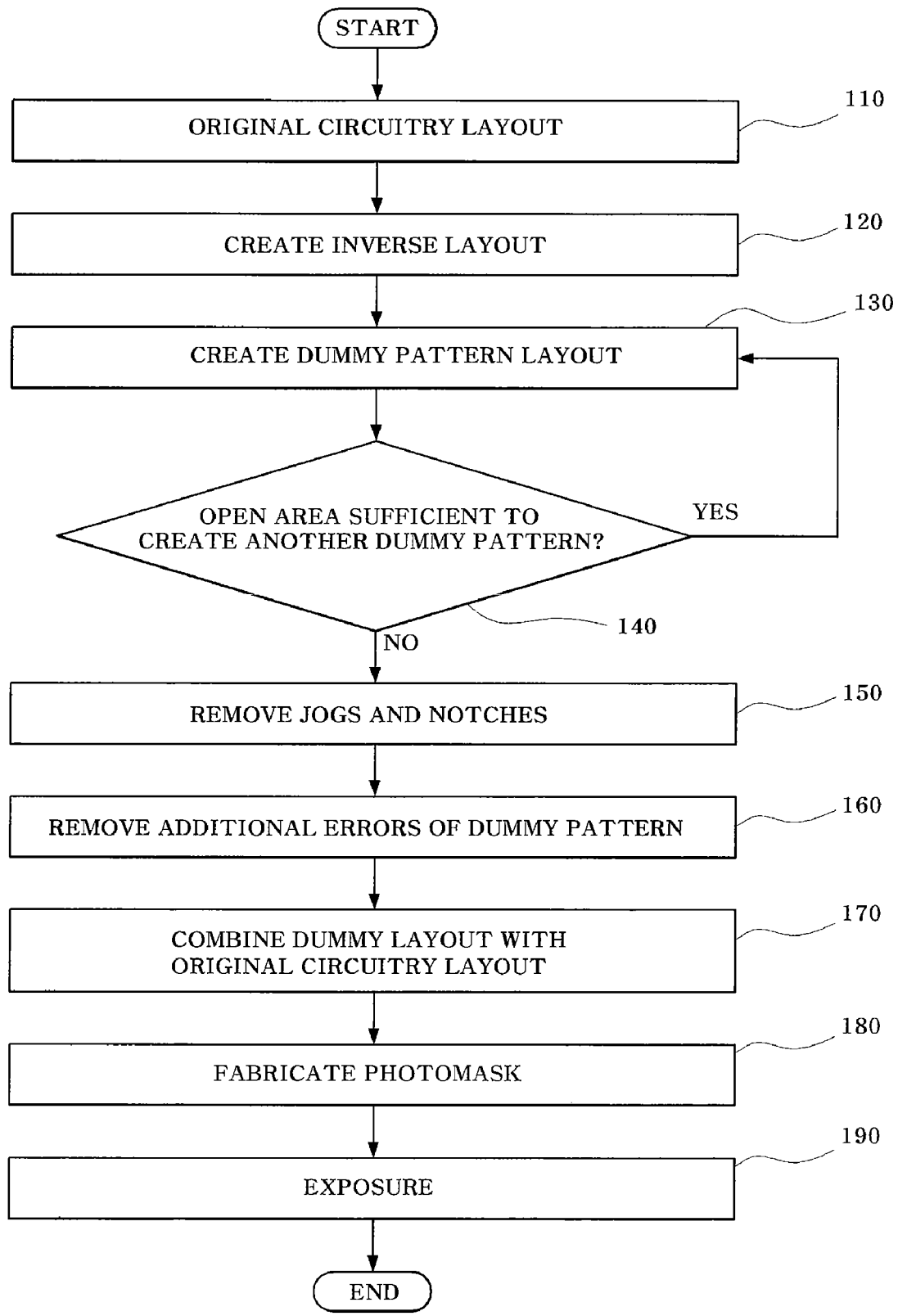
FIG. 1 is a flowchart schematically illustrating a semiconductor device fabrication method using a circuit layout having a self-assembled dummy pattern inserted in accordance with an embodiment of the present invention.
Figure 2:
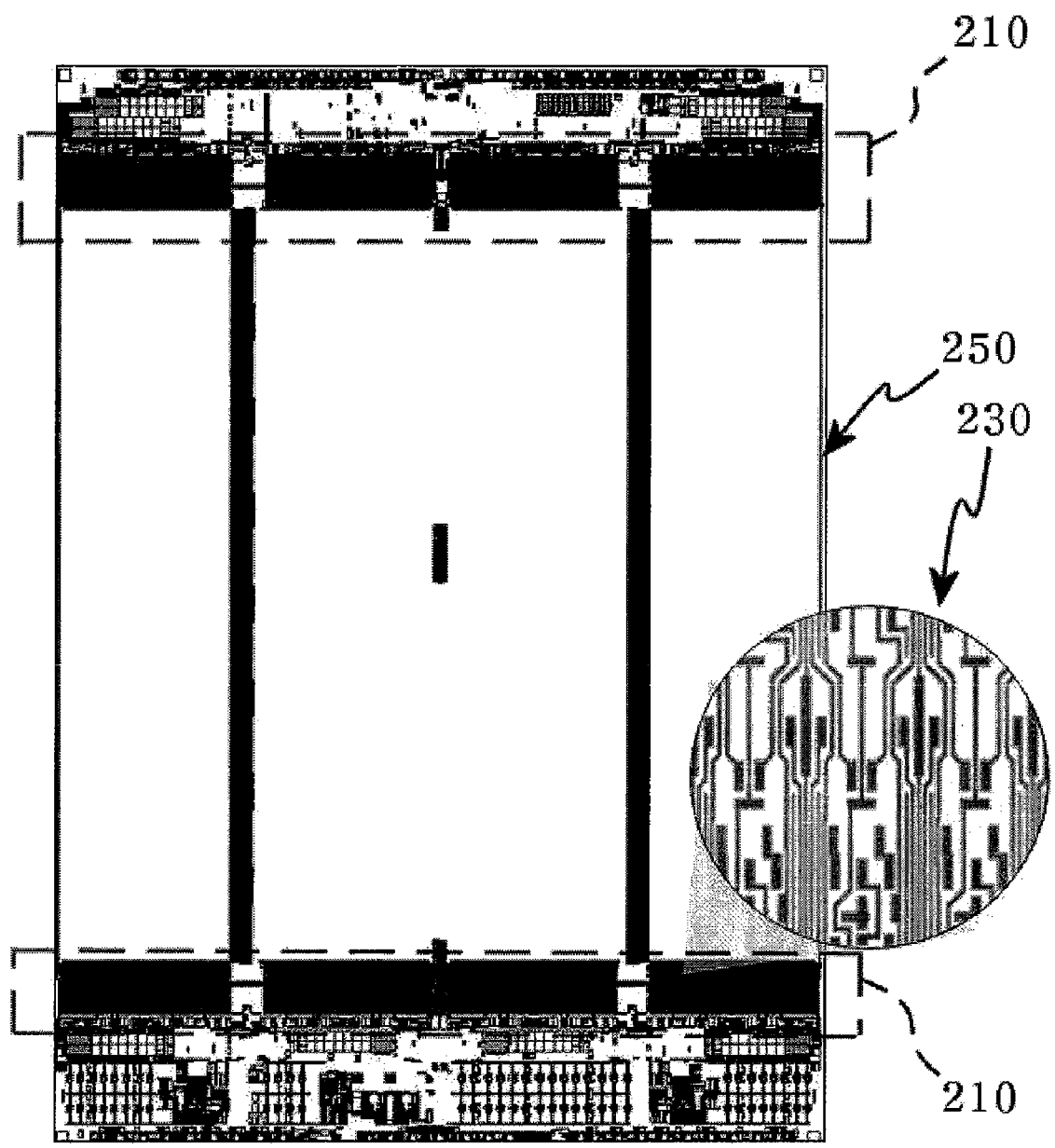
FIGS. 2 to 22 are schematic layout views for explaining the semiconductor device fabrication method using the circuit layout having the self-assembled dummy pattern inserted in accordance with an embodiment of the present invention.

Referring to FIG. 1, a layout of a circuit pattern is first designed (step 110). As shown in FIG. 2, the original circuit layout may be a circuit layout 230 for bit lines in a page buffer region 210 of a NAND type flash memory device. FIG. 2 schematically illustrates a planar arrangement in a multi-level cell (MLC) type chip structure.

The page buffer region 210 is a region where a page buffer circuit is arranged. The page buffer circuit performs operations such as read, write (or programming), and erase operations for memory cells formed in cell regions. In the case of a MLC type flash memory device, in which data of 2 bits or more is stored in one memory cell, the page buffer region 210 has a relatively large area due to the complex configuration of the associated page buffer circuit. Since the page buffer region 210 has a large width of 700 μm or more, a long time (e.g., 48 hours or more) may be required for the manual insertion of dummy patterns required for the optimization of light exposure and etch processes.

The method of inserting dummy patterns into the page buffer region 210 may be different from that of a DRAM device or the like because the configuration of the page buffer region 210 is different for each one. This method may also be different from a method used for dummy patterns required for a CMP process. In order to simplify things and avoid the application of numerous rules required for the insertion of dummy patterns, a method for inserting a dummy pattern into an original circuit layout using a computer-based arithmetic operation is proposed.

Figure 3:
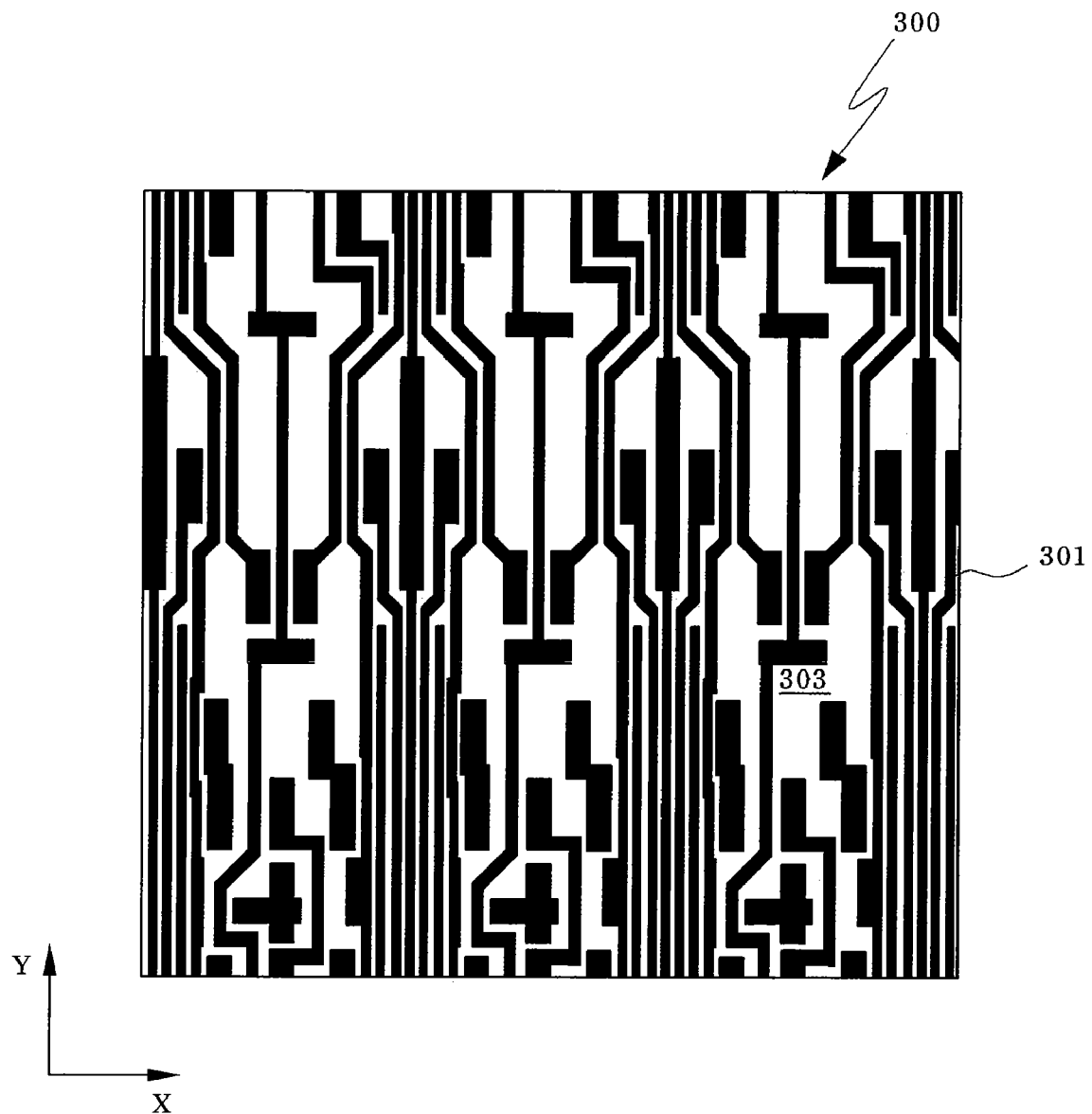

Referring to FIG. 3, a designed original circuit layout 300 is shown which is to be implemented onto a semiconductor substrate. The original circuit layout 300 of FIG. 3 preferably includes the bit line circuit layout 230 which makes up a page buffer. As shown in FIG. 3, empty areas 303 having various shapes and sizes are formed between adjacent bit line circuit patterns 301. In order to improve the process margin for a light exposure process, an etch process, and an accuracy of pattern transfer, dummy patterns may be inserted into these empty areas 303. In order to create a layout of the dummy patterns to be inserted into the empty areas 303, data for the original circuit layout 300 is used. Meanwhile, in layout figures, the direction in which the circuit patterns 301 extends is defined as the Y-axis, and the direction perpendicular to the Y-axis is defined as an X-axis.

Figure 4:
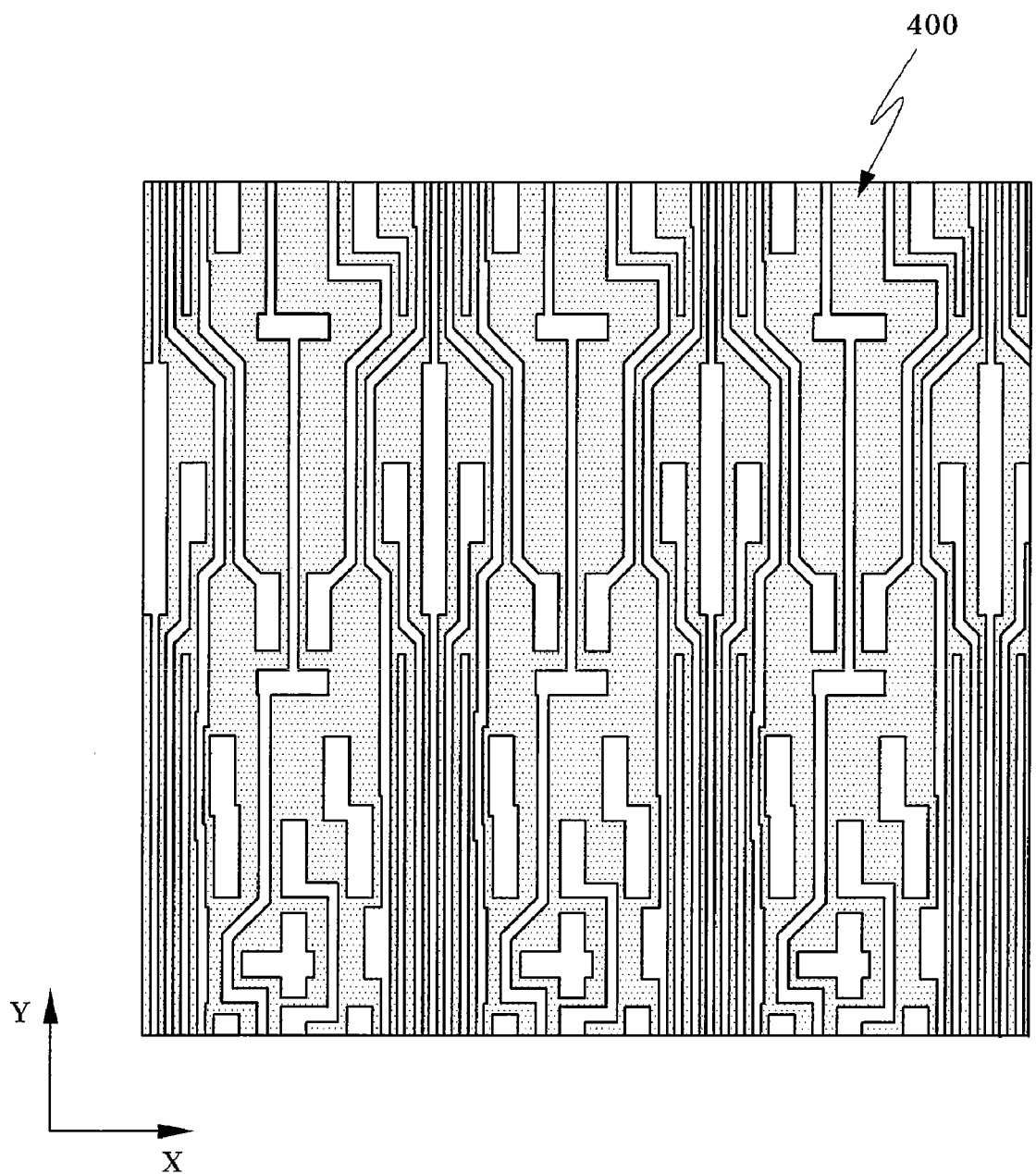

Referring to FIG. 4, an inverse layout 400, which is an inverse image of the original circuit layout 300, is then created (step 120 in FIG. 1). The inverse layout 400 may be created by performing a computer-based operation with the data for the original circuit layout 300. The inverse layout 400 is the layout of the empty areas 303 in the original circuit layout 300.

A dummy pattern layout is then created by reducing the pattern size of the inverse layout 400 created so that the resultant inverse layout has a predetermined spacing from the original circuit layout 300 (step 130 in FIG. 1). For example, the dummy pattern layout can be created by reducing the size of the inverse layout 400 and removing overlapped portions of the size-reduced layouts to create two reduced layouts having different sizes.

Figure 5:
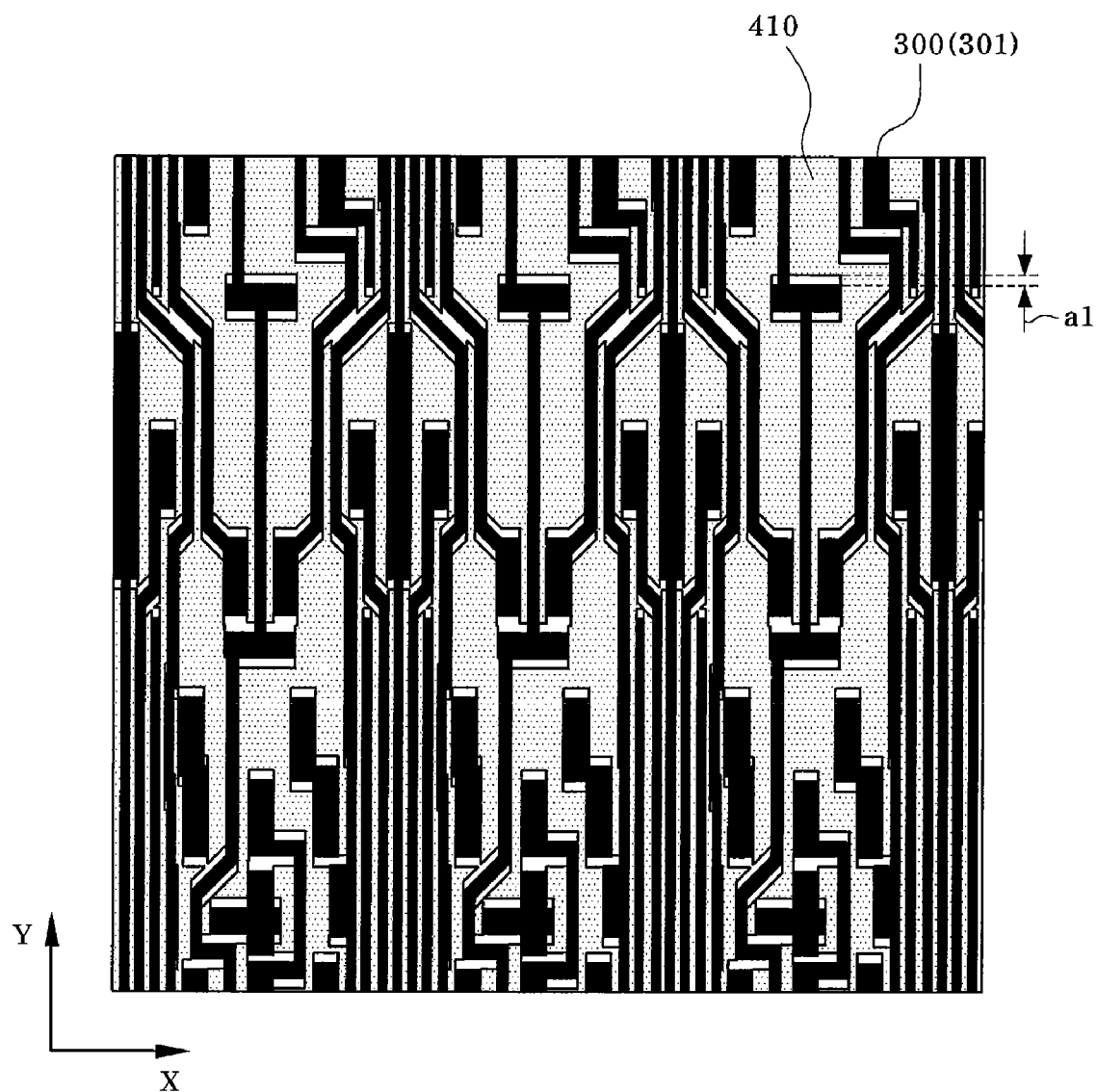

Referring to FIG. 5, a first reduced layout 410 is obtained by reducing the size in the Y direction of the inverse layout 400 (FIG. 4) by a first reduction width a1. In this case, the entire area of the inverse layout 400 is reduced in the Y-axis direction by shifting the outlines of the patterns of the inverse layout 400 from both the top and bottom sides in the Y-direction by the first reduction width a1. In this case, the first reduction width a1 may be determined by the designer. For example, the first reduction width a1 may be set to correspond to a minimum size allowing execution of a light exposure process in the Y-axis direction.

The first reduction width a1 may be determined, taking into consideration the exposure resolution in the Y-axis direction. Accordingly, the light exposure conditions may be taken into account in the procedure for setting dummy patterns. This can be seen not only in the case in which a symmetrical illumination system such as a conventional illumination system is used in the light exposure process, but also in the case in which an asymmetrical illumination system such as a dipole illumination system or a quadrupole illumination system is used in the light exposure process. The dipole illumination system uses irises with light transmission regions spaced apart from each other in one axial direction, for example, the X-axis direction. In this case, the resolution in the X-axis direction is higher than the resolution in the Y-axis direction, due to an inference of the primary light. When the first reduction width a1 is set in the dummy pattern creation procedure, taking into consideration the resolution in the Y-axis direction, the influence of light exposure conditions can be taken into account on the setting of dummy patterns.

The first reduction width a1 is set to correspond to the actual spacing between the circuit pattern 301 of the circuit layout 300 and the dummy pattern. In order to improve the uniformity of the dimensions of the dummy pattern and circuit pattern 301, the first reduction width a1 may be set to correspond to the line width of the circuit pattern 301.

Since the first reduced layout 410 has a size reduced from the inverse layout 400 in the Y-axis direction, it has outlines spaced apart from those of the circuit pattern 301 in the Y-axis direction by the first reduction width a1. Thus, the Y-axis outlines of the first reduced layout 410 depend on the Y-axis outlines of the original circuit layout 300 defining the circuit pattern 301.

Figure 6:
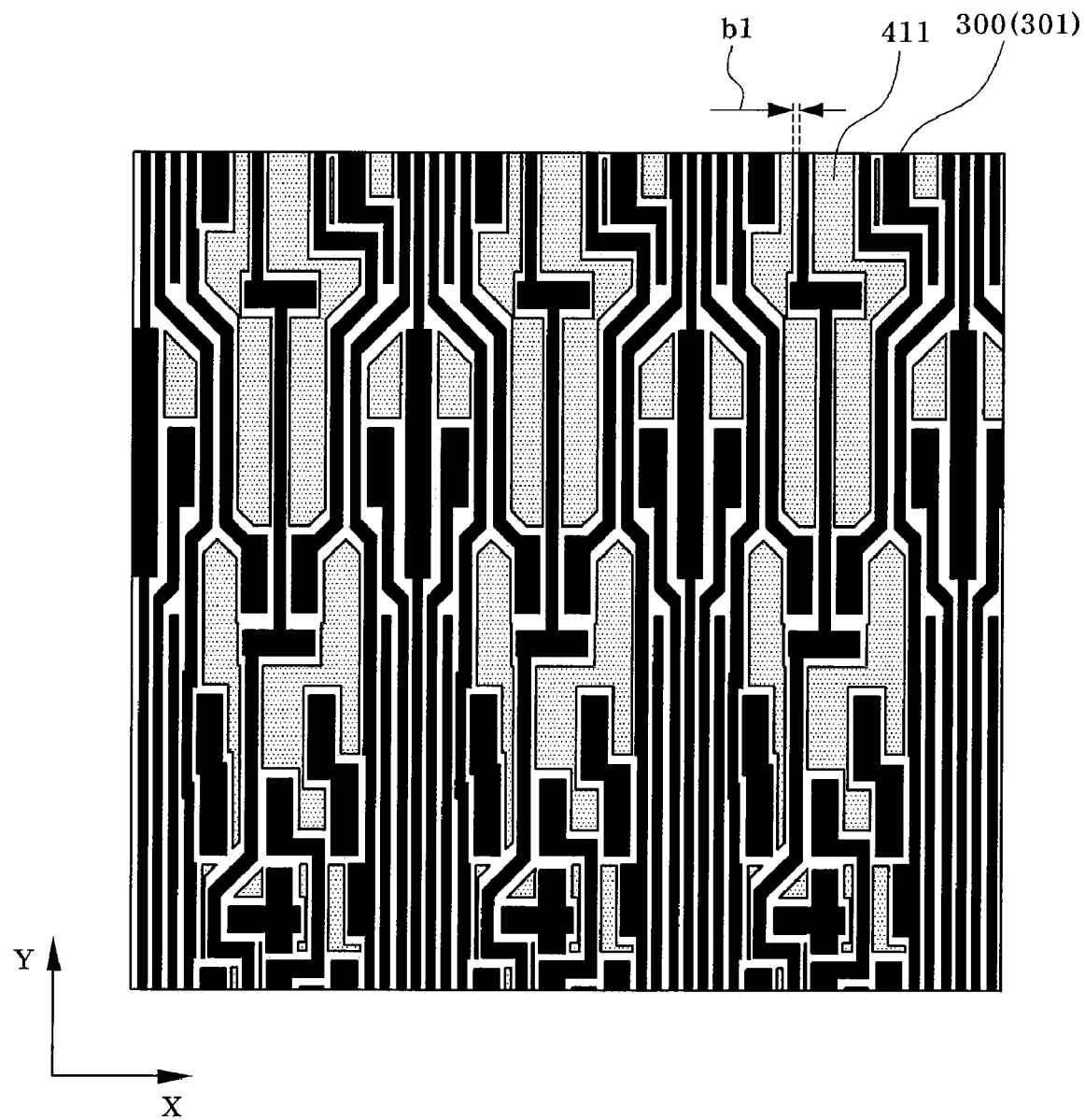

Referring to FIG. 6, a second reduced layout 411 is obtained by reducing the size in the X-direction of the first reduced layout 410 by a second reduction width b1. In this case, the entire area of the first reduced layout 410 is reduced in the X-axis direction by shifting the outlines of the patterns of the first reduced layout 410 from both the left and right sides in the X-direction by the second reduction width b1.

In this case, the second reduction width b1 may be determined by the designer. For example, the second reduction width b1 may be set to correspond to a minimum size allowing execution of a light exposure process in the X-axis direction. The second reduction width b1 is set to correspond to the actual spacing between the circuit pattern 301 of the circuit layout 300 and the dummy pattern. In order to improve the uniformity of the dimensions of the dummy pattern and circuit pattern 301, the second reduction width b1 may be set to correspond to the line width of the circuit pattern 301. Similarly to the setting of the first reduction width a1, light exposure conditions may be taken into consideration in setting the second reduction width b1 so that the influence of the resolution in the X-axis direction can be accounted for.

Since the second reduced layout 411 has a size reduced in the X-axis direction from the first reduced layout 410, the second reduced layout 411 has outlines spaced apart from the circuit pattern 301 in the Y-axis direction by the first reduction width a1 and in the X-axis direction by the second reduction width b1. Thus, the Y-axis and X-axis outlines of the second reduced layout 411 depend on both the Y-axis and X-axis outlines of the original circuit layout 300 and its circuit pattern 301. The second reduced layout 411 defines an outline which is one of two outlines defining the dummy pattern, and is arranged near the circuit pattern 301, relative to the other outline. In order to define the other outline of the dummy pattern, another reduced layout having outlines depending on the outlines of the second reduced layout 411 is obtained by reducing the size of the second reduced layout 411.

Figure 7:
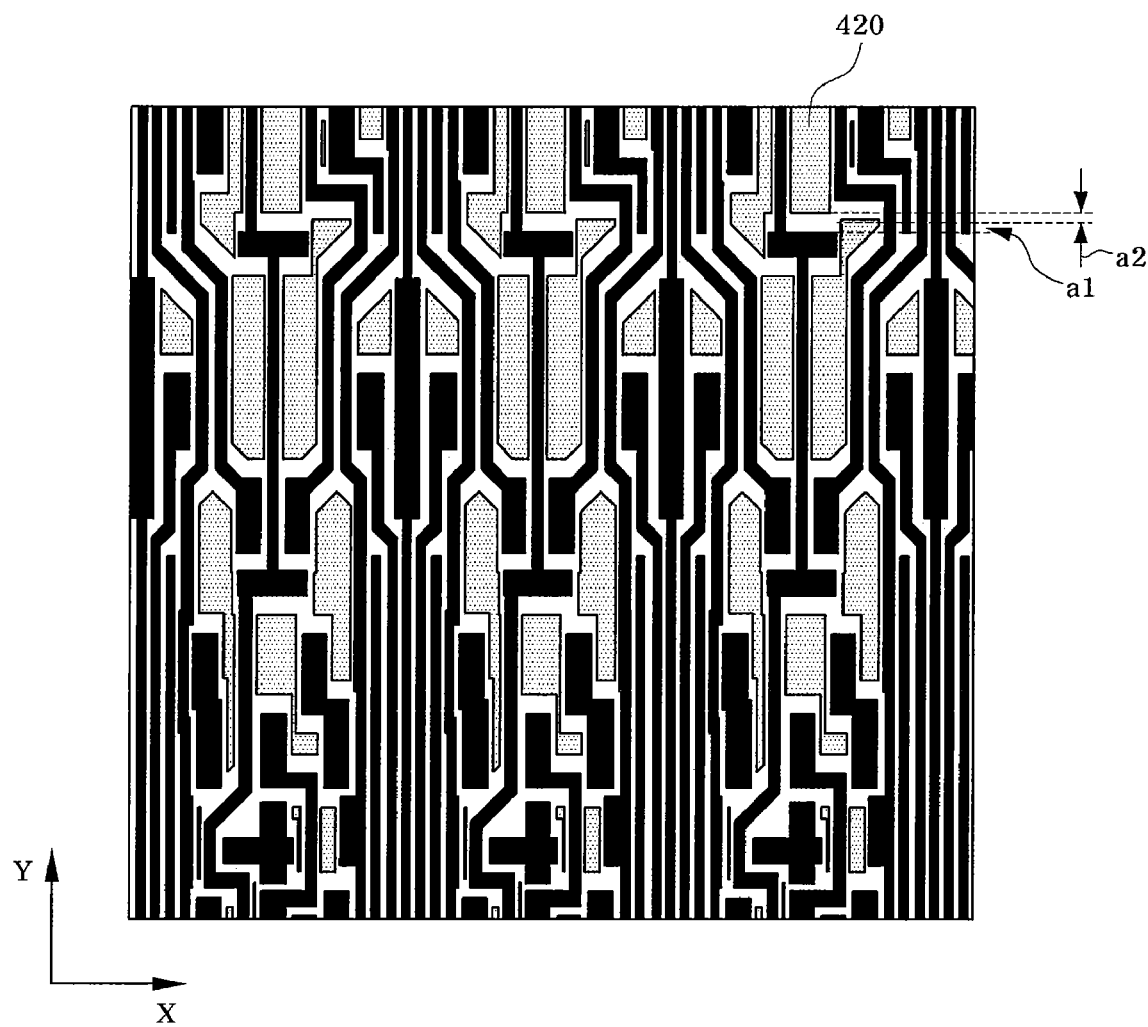

Referring to FIG. 7, a third reduced layout 420 is obtained by reducing the size in the Y-direction of the second reduced layout 411 (FIG. 6) by a third reduction width a2. In this case, the entire area of the second reduced layout 411 is reduced in the Y-axis direction by shifting the outlines of the patterns of the second reduced layout 411 from both the top and bottom sides in the Y-direction by the third reduction width a2. The third reduced layout 420 obtained is a layout reduced from the inverse layout 400 (FIG. 4) by a width of "a1+a2" in the Y-axis direction. In this case, the third reduction width a2 may be determined by the designer. For example, the third reduction width a3 may be set to correspond to a minimum size allowing execution of a light exposure process in the Y-axis direction. Taking into consideration the regularity or uniformity of the entire area of the layout, the third reduced width a2 may be set to equal the first reduced width a1.

The third reduction width a2 may be determined by taking into consideration the exposure resolution in the Y-axis direction. Accordingly, light exposure conditions may be taken into account in the procedure for setting dummy patterns. This can be seen not only in the case in which a symmetrical illumination system such as a conventional illumination system is used in the light exposure process, but also in the case in which an asymmetrical illumination system such as a dipole illumination system or a quadrupole illumination system is used in the light exposure process. Accordingly, the influence of light exposure conditions can be taken into consideration in the setting of dummy patterns. The third reduction width a2 may be set to correspond to the Y-axis line width of the dummy pattern arranged adjacent to the circuit pattern 301 of the original circuit layout 300. In order to improve the uniformity of the dimensions of the dummy pattern and circuit pattern 301, the third reduction width a2 may be set to correspond to the line width of the circuit pattern 301.

Since the third reduced layout 420 has a size reduced from the second reduced layout 411 in the Y-axis direction, it has outlines spaced apart from those of the circuit pattern 301 in the Y-axis direction by the third reduction width a2. Thus, the Y-axis outlines of the third reduced layout 420 depend on the Y-axis outlines of the original circuit layout 300 and its circuit pattern 301.

Figure 8:
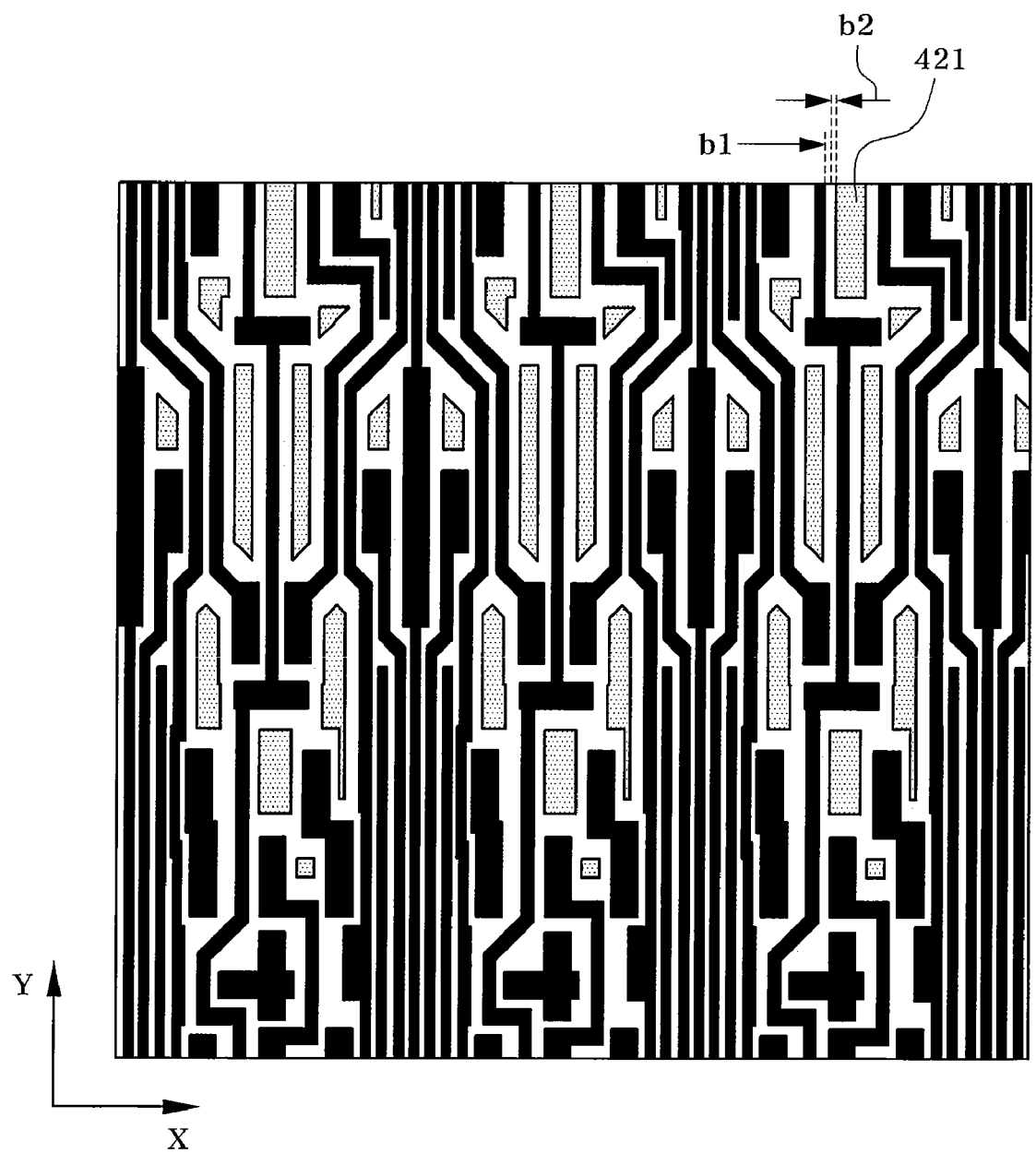

Referring to FIG. 8, a fourth reduced layout 421 is obtained by reducing the X-axis size of the third reduced layout 420 by a fourth reduction width b2 in the X-axis direction. In this case, the entire area of the third reduced layout 420 is reduced in the X-axis direction by shifting the outlines of the patterns of the third reduced layout 420 from both the left and right sides in the X-direction by the fourth reduction width b2. In this case, the fourth reduction width b2 may be determined by the designer. For example, the fourth reduction width b2 may be set to correspond to a minimum size allowing execution of a light exposure process in the X-axis direction. Since the fourth reduced layout 421 is spaced apart from the circuit pattern 301 of the original circuit layout 300 by the fourth reduced width b2 corresponding to "b1+b2", it defines the other outline of the dummy pattern. That is, the fourth reduced layout 421 is a layout reduced from the inverse layout 400 (FIG. 4) by a width of "b1+b2" in the X-axis direction.

The fourth reduced width b2 may be set to correspond to the line width of the dummy pattern in the X-axis direction. In order to improve the uniformity of the dimensions of the circuit pattern 301, the fourth reduction width b2 may be set to correspond to the line width of the circuit pattern 301. Similarly to the setting of the second reduction width b1, the light exposure conditions may be taken into consideration in setting the fourth reduction width b2 so that the influence of the resolution in the X-axis direction can be accounted for.

Since the fourth reduced layout 421 has a size reduced from the third reduced layout 420 in the X-axis direction, it has outlines spaced apart from those of the circuit pattern 301 in the Y-axis direction by the width of "a1+a2" and in the X-axis direction by the width of "b1+b2". Thus, the Y-axis and X-axis outlines of the fourth reduced layout 421 depend on both the Y-axis and X-axis outlines of the original circuit layout 300 (i.e., the circuit pattern 301). Meanwhile, the first and third reduction widths a1 and a2 may be set to equal each other. Also, the second and fourth reduction widths b1 and b2 may be set to equal each other.

Thereafter, the layout of a first dummy pattern arranged nearest to the circuit pattern 301 of the original circuit layout 300 is obtained using data for the second and fourth reduced layouts 411 and 421 (step 130 in FIG. 1).

Figure 9:
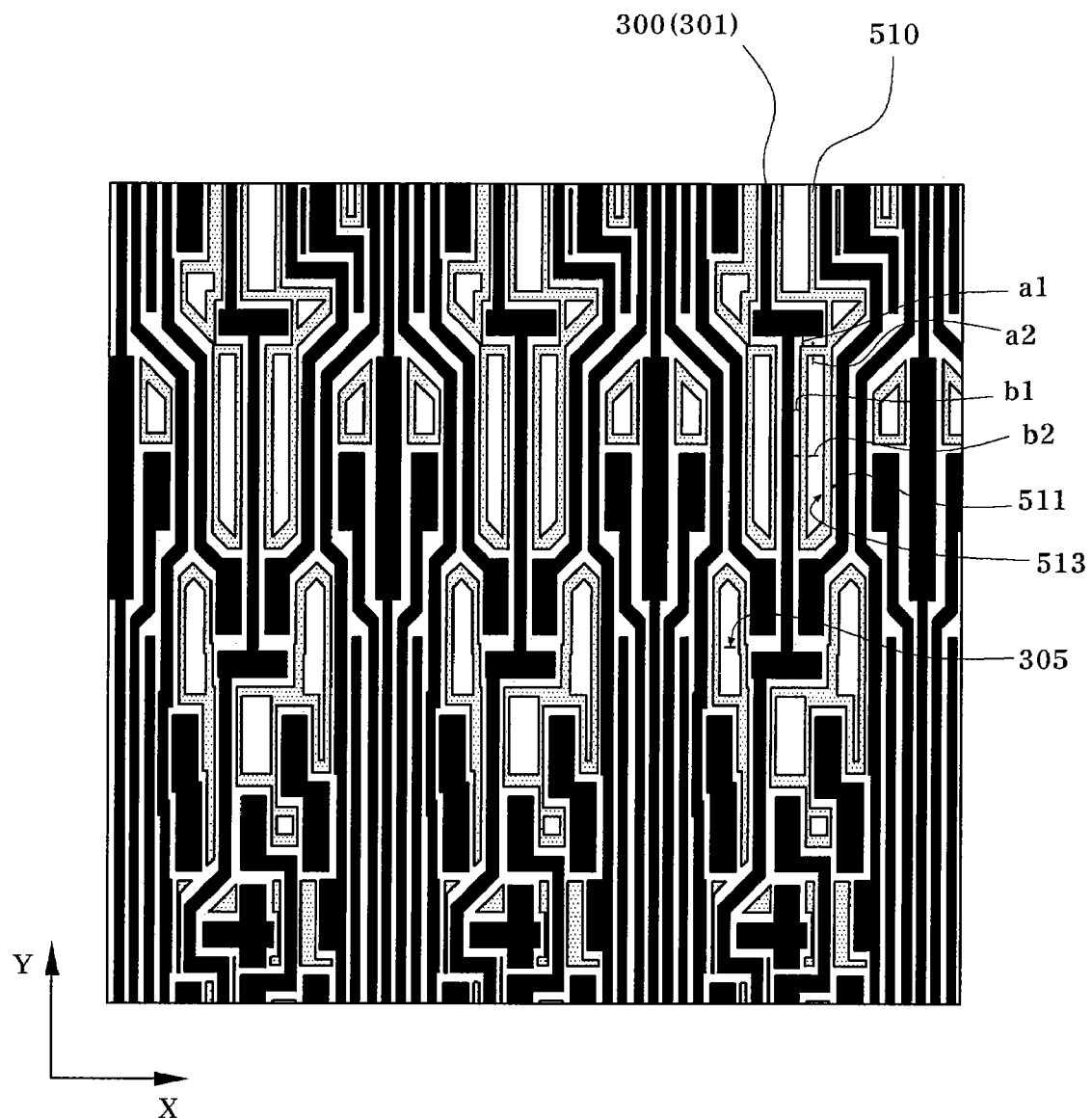

Referring to FIG. 9, a layout 510 of a first dummy pattern is obtained by deducting the fourth reduced layout 421 from the second reduced layout 411 (FIG. 6). The outline of the second reduced layout 411 defines a first outline 511 of the first dummy pattern layout 510 arranged near the circuit pattern 301. The outline of the fourth reduced layout 421 defines a second outline 513 of the first dummy pattern layout 510 opposite to the first outline 511. Accordingly, the first dummy pattern is set to have an X-axis line width of b2, a Y-axis line width of a2, an X-axis spacing of b1, and a Y-axis spacing of a1. Since such data for the layouts 411 and 421 are coordinate data (or obtained by algorithm), the deduction of the fourth reduced layout 421 from the second reduced layout 411 can be achieved in accordance with a Boolean logic operation, using a computer.

The first dummy pattern layout 510 obtained in the above-described manner depends on the outlines of the inverse layout 400, and extends out along the outline of the circuit pattern 301. Accordingly, it is possible to eliminate or suppress the overlapping of the first dummy pattern layout 510 with the layout of the circuit pattern 301 in the original circuit layout 300. Also, light exposure conditions such as illumination system conditions to be used in a light exposure process and X and Y-axis resolutions are taken into consideration when the first dummy pattern layout 510 is extracted so that they are reflected on the first dummy pattern layout 510. Accordingly, it is possible to suppress pattern defects, such as pattern bridge or pattern necking, which may be generated in the light exposure process, and to automatically correct the pattern layout.

After the above-described setting of the first dummy pattern layout 510, it is determined whether or not the resultant layout has a second empty or open area 305 allowing creation of another dummy pattern, and whether or not the second open area 305 has sufficient size to allow for the creation of a second dummy pattern (step 140 in FIG. 1). The resultant layout is a combination of the original circuit layout 300 with the first dummy pattern layout 510. If there is enough room, a layout of the second dummy pattern is created, based on the inverse layout 400 or original circuit layout 300 in the same manner as described above. In this case, the creation of the second dummy pattern layout can be carried out in the same manner as described above with reference to FIGS. 5 to 9. When the reduction width is set to twice the reduction width used in the above-described case, it is possible to create the second dummy pattern layout without causing the second dummy pattern layer to overlap with the first dummy pattern layout 510.

Figure 10:
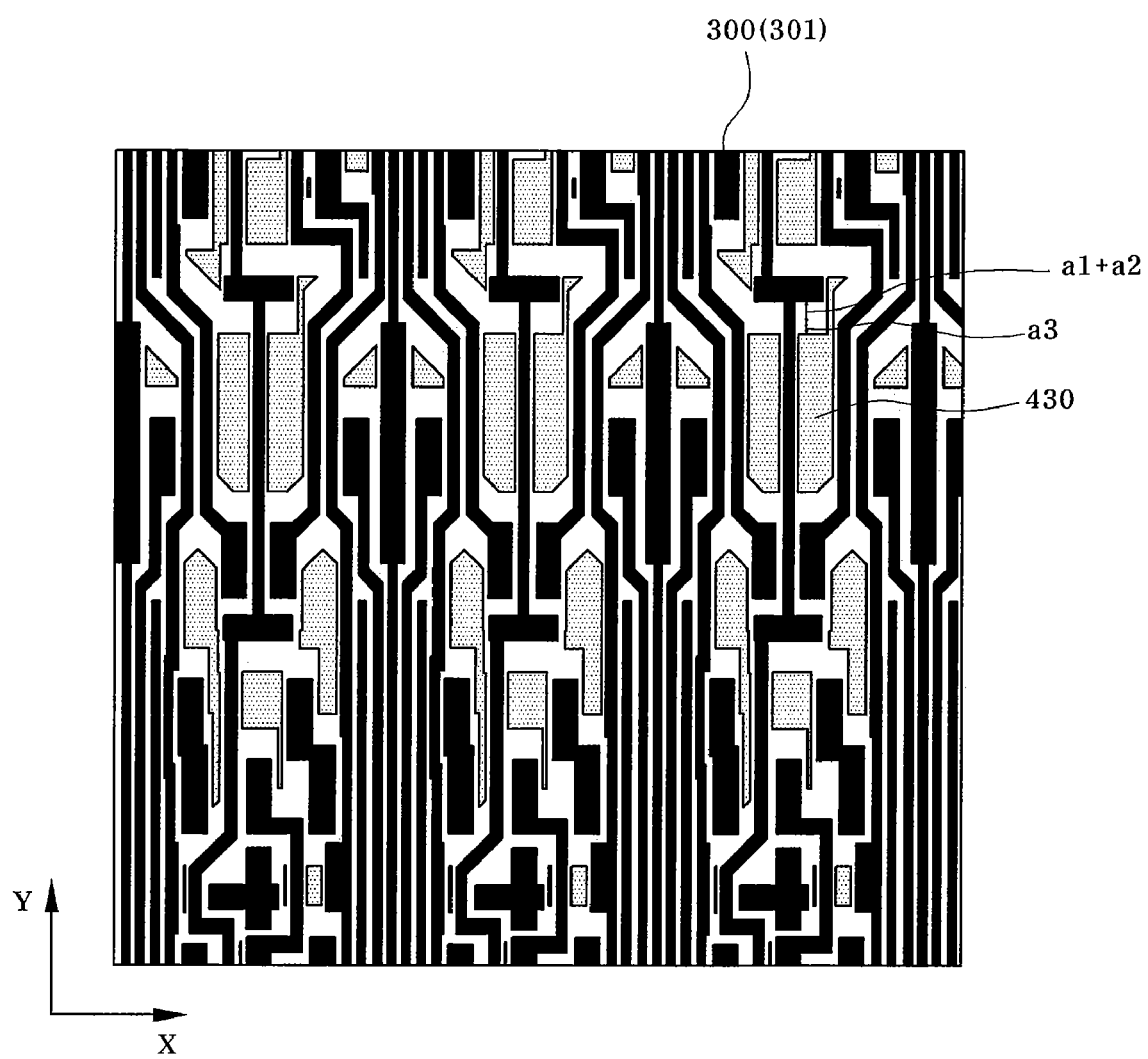

Referring to FIG. 10, a fifth reduced layout 430 is created by reducing the inverse layout 400 shown in FIG. 4, or reducing one of the reduced layouts 410, 411, 420, and 421 respectively shown in FIGS. 5 to 8. For example, the fifth reduced layout 430 is obtained by reducing the second reduced layout 411 by the third reduction width a2 and a fifth reduction width a3 in the Y-axis direction. It can be seen that the fifth reduced layout 430 is a layout reduced in accordance with the application of an increased reduction width as compared to the second reduced layout 411. If it is assumed that "a1", "a2", and "a3" are equal, and are the minimum exposure line width attainable in a light exposure process, the Y-axis spacing between the circuit pattern 301 and the fifth reduced layout 430 is three times the minimum exposure line width. Also, the Y-axis spacing between the outline of the second reduced layout 411 and the outline of the fifth reduced layout 430 is twice the minimum exposure line width.

Since the fifth reduced layout 430 is set, based on the second reduced layout 411, the outline of the fifth reduced layout 430 depends on the layout of the circuit pattern 301. Accordingly, it is possible to suppress or eliminate the overlapping of the fifth reduced layout 430 with the circuit pattern 301 or first dummy pattern layout 510 and generation of pattern defects. Also, it is possible to suppress the generation of pattern defects in the light exposure process because of light exposure conditions or illumination system conditions, and resolutions can be reflected on the setting of the fifth reduction width a3.

Figure 11:
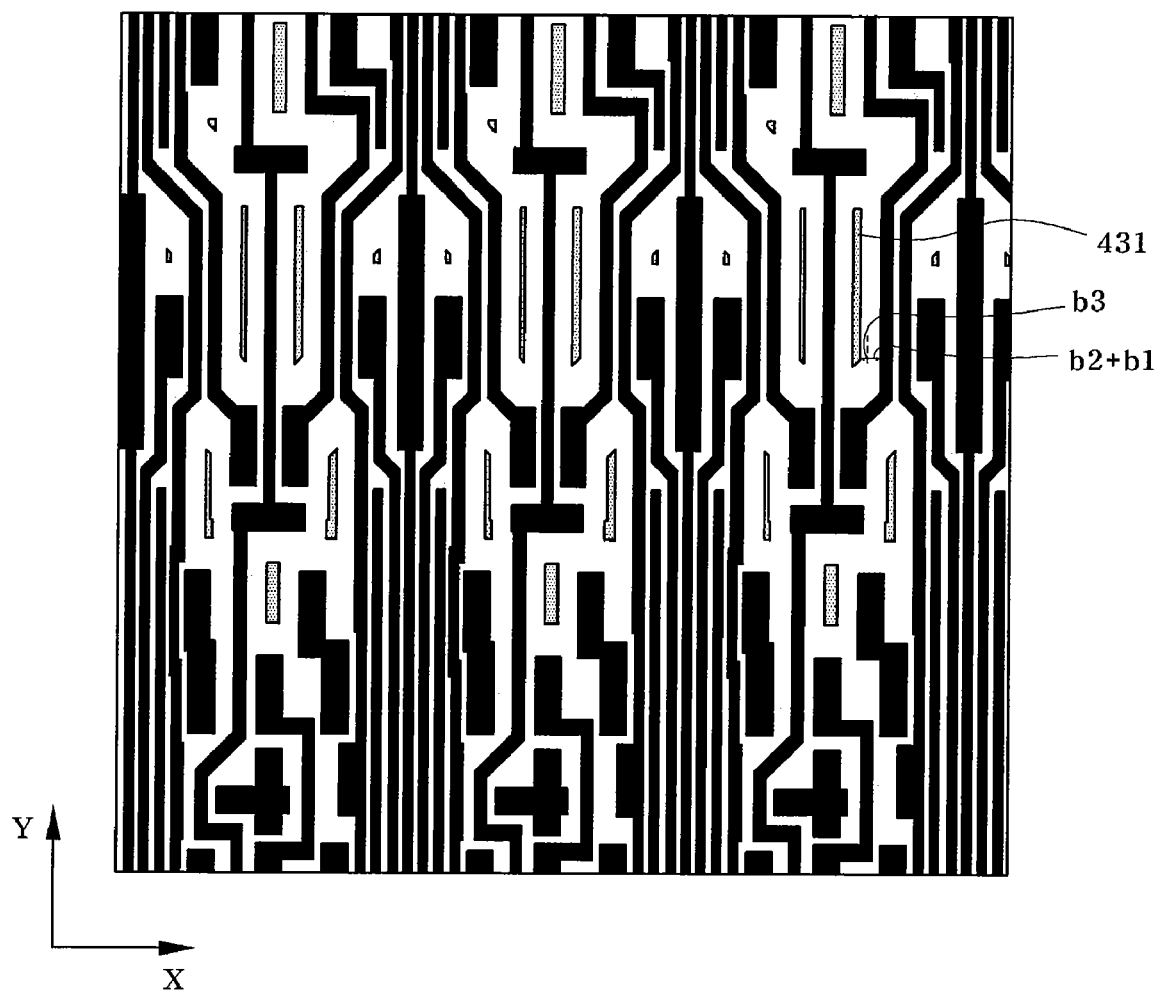

Referring to FIG. 11, a sixth reduced layout 431 is created by reducing the X-axis size of the fifth reduced layout 430 by the fourth reduction width b2 and a sixth reduction width b3 in the X-axis direction. In this case, the sixth reduction width b3 can be set to equal "b1" or "b2". Accordingly, the sixth reduced layout 431 has an X-axis spacing larger than that of the fifth reduced layout 430 by twice the second reduction width b1. That is, the X-axis spacing of the sixth reduced layout 431 from the circuit pattern 301 corresponds to three times the second reduction width b1.

Figure 12:
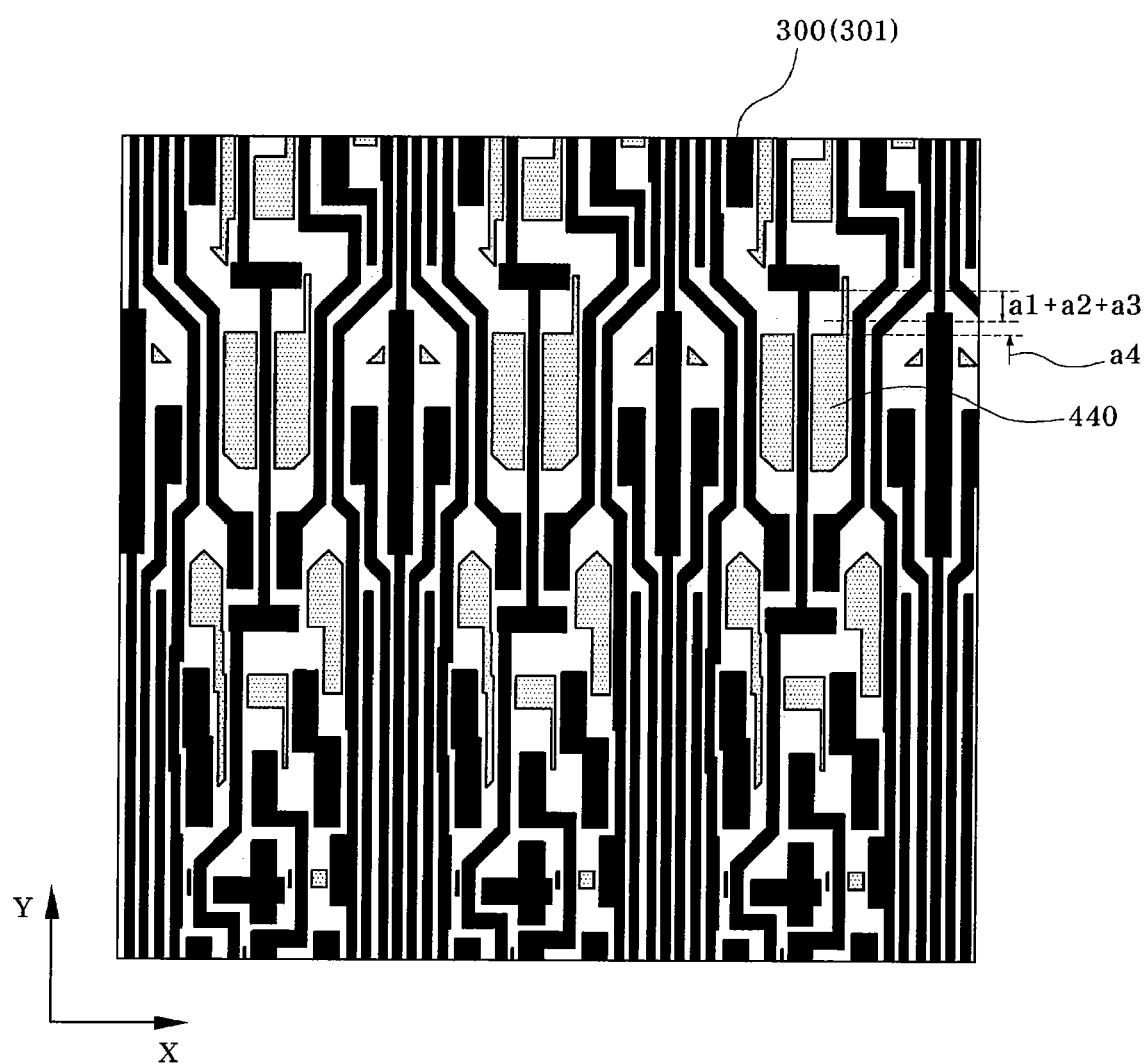

Referring to FIG. 12, a seventh reduced layout 440 is obtained by reducing the size in the Y-direction of the second reduced layout 411 (FIG. 6) by a width of "a2+a3+a4 (a4: seventh reduction width)". This procedure can be carried out in the same manner as described in the case in which "a2" and "a1" is set as the third reduction width, upon reducing the third reduced layout 420 of FIG. 7. In this case, the seventh reduced layout 440 can be obtained by applying, to the third reduced layout 420, a Y-axis reduction width corresponding to twice the Y-axis reduction width originally applied to the third reduced layout 420.

Figure 13:
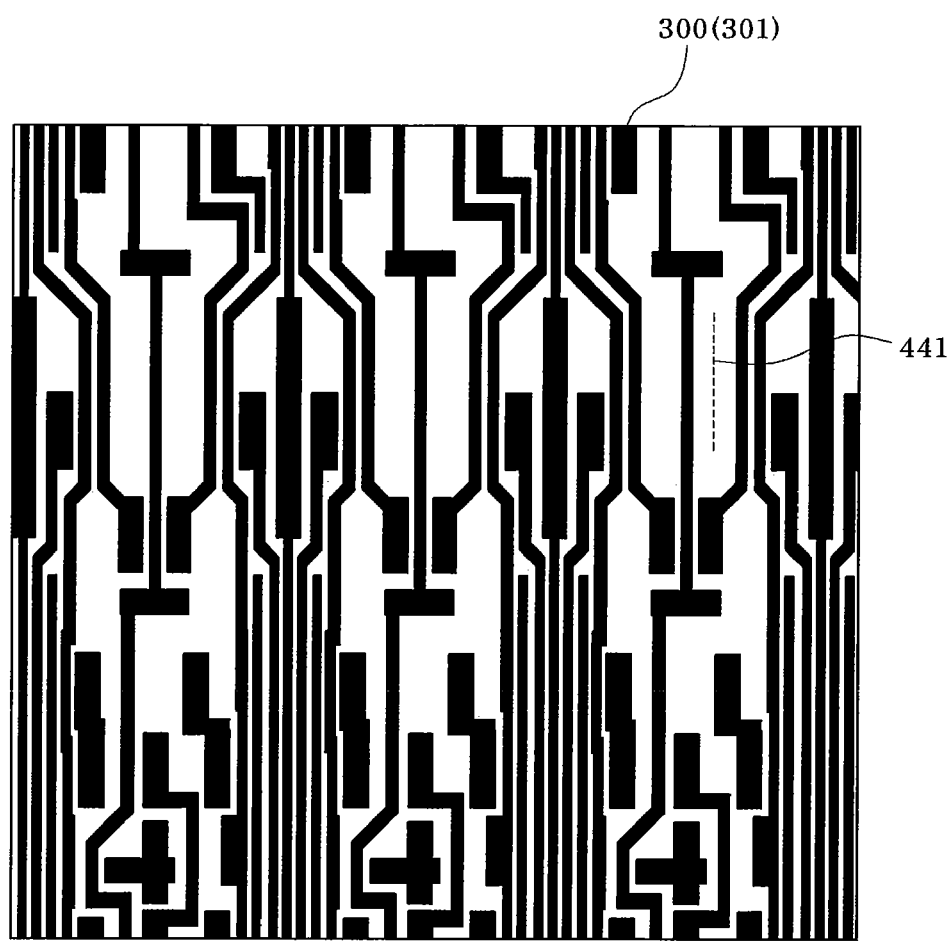

Referring to FIG. 13, an eighth reduced layout 441 is obtained by reducing the X-axis size of the seventh reduced layout 440 by a width of "b2+b3+b4 (a4: eighth reduction width)". It can be seen that there is no X-axis margin allowing the eighth reduced layout 441 to be created as a substantial layout.

Figure 14:
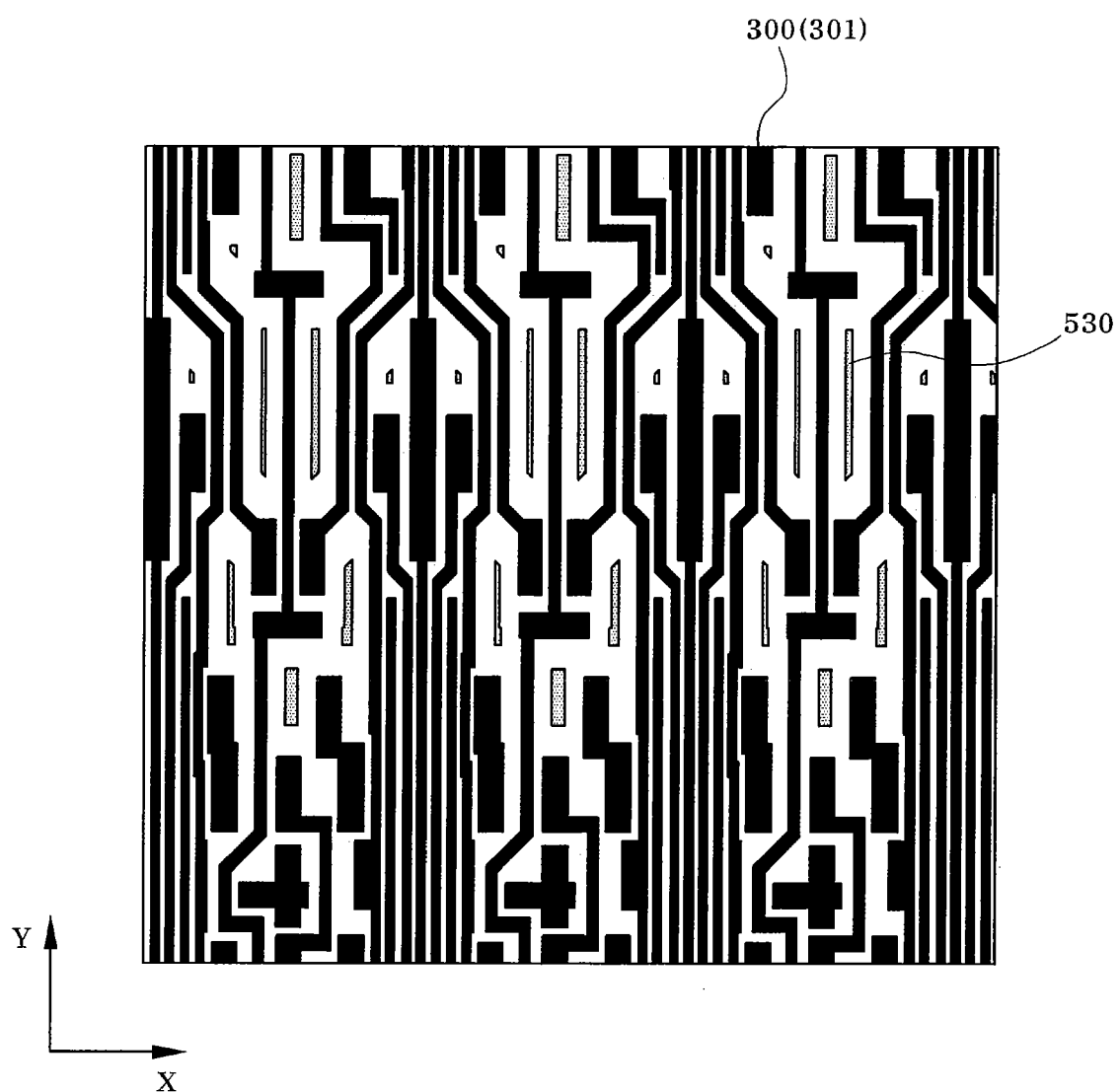

Referring to FIG. 14, a layout 530 of a second dummy pattern, which is secondarily arranged on the layout of the circuit pattern 301 in the original circuit layout 300, is obtained using data for the obtained sixth and eighth layouts 431 and 441 (repetition of "130" in FIG. 1). This procedure may be repeated until a substantial reduced layout is no longer created, as in the case in which the eight reduced layout 441 shown in FIG. 13 is created. Since the eighth reduced layout 441 is not actually created, the second dummy pattern layout 530 is a layout having an outline corresponding to that of the sixth reduced layout 431. The data as to the outline of the second dummy pattern layout 530 is automatically obtained by deducting the sixth reduced layout 431 from the eight reduced layout 441 in accordance with a computer-based operation, as in the creation of the first dummy pattern layout 510.

Thus, the second dummy pattern layout 530, and layouts of further dummy patterns can be obtained by repeatedly executing an algorithm similar to that used to create the first dummy pattern layout 510. One difference is that an increased layout reduction width is applied. Also, the second dummy pattern layout 530, and layouts of further dummy patterns can be obtained by a layout reduction or deduction carried out based on the original circuit layout 300 or the inverse layout 400. Accordingly, the outline of the second dummy pattern layout 530 depends on the outline of the original circuit layout 300.

Referring back to FIG. 1, the creation of another dummy pattern layout can be repeatedly executed as long as the open area ("305" in FIG. 9) allowing creation of the dummy pattern is secured. The dummy pattern creation can be automatically achieved through a computer-based data operation according to the above-described algorithm, without using a manual operation. Accordingly, the time taken for the dummy pattern creation can be greatly reduced.

Figure 15:
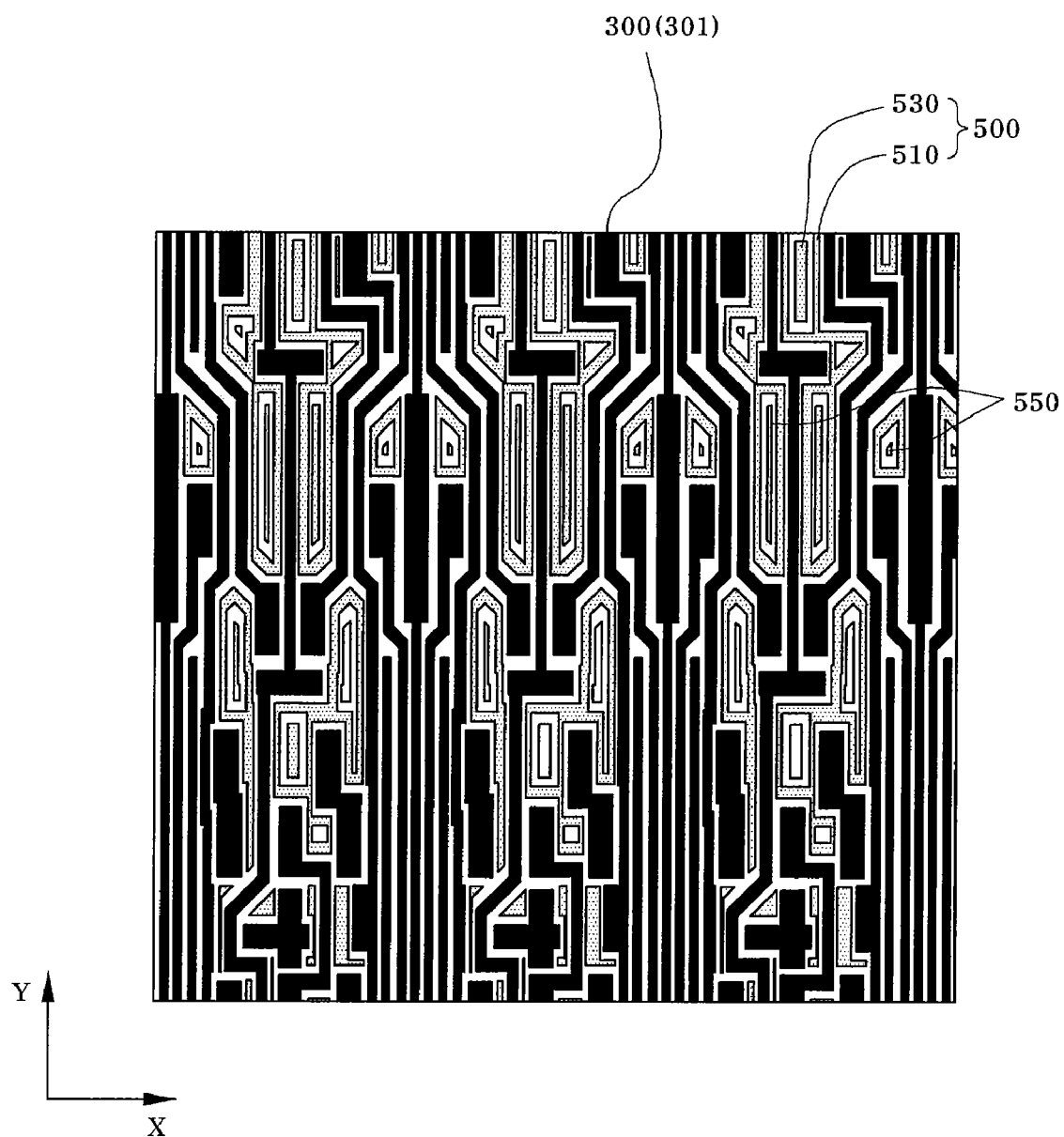

Referring to FIG. 15, a combined circuit layout is obtained by inserting the obtained first and second dummy pattern layouts 510 and 530 (collectively referred to as a "dummy pattern layout 500") into the original circuit layout 300, and thus, creating a combination of the original circuit layout 300 with the dummy pattern layout 500. Thereafter, a procedure for removing, from the dummy pattern layout 500, circuit portions undesirable for dummy patterns that may have formed during creation of dummy patterns, for example, small protrusions such as jogs or small grooves such as notches (step 150 in FIG. 1). In addition to jogs or notches, additional defective areas, which have an unsuitable line width, or are difficult to transfer to a wafer in a light exposure process, are removed (step 160 in FIG. 1). The procedure for removing such dummy errors, which are designated by reference numeral "550" in FIG. 15), may be achieved using a method for checking and correcting a designed layout, for example, a rule check.

Figure 16:
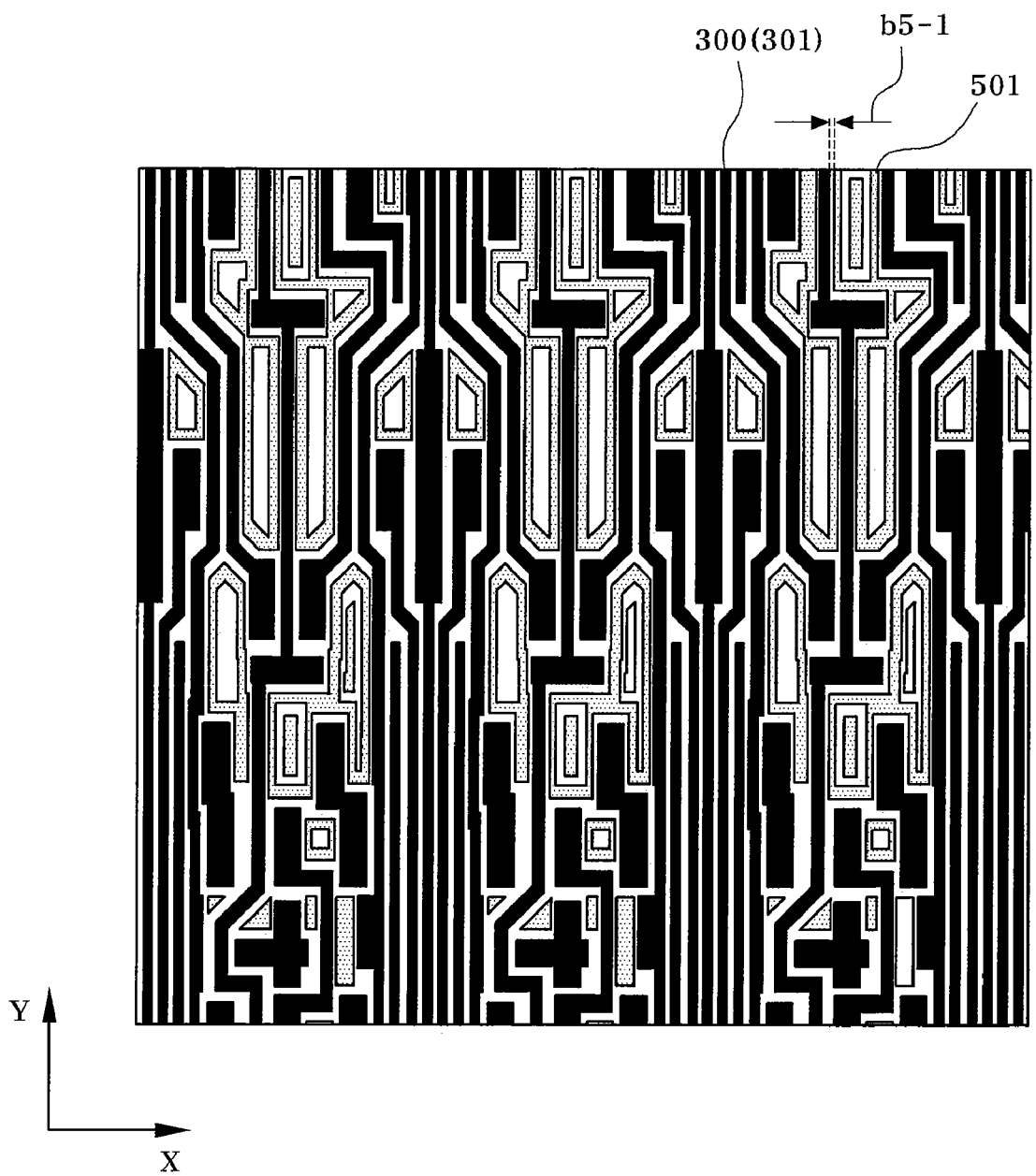

Referring to FIG. 16, the dummy errors 550 are removed from the dummy pattern layout ("500" in FIG. 15). For example, this removal is achieved by reducing the spacing between the adjacent patterns, "b5", checking the reduced pattern spacing, using a rule check or the like, and removing defective areas where pattern defects such as pattern bridge may be formed. In accordance with correction of the dummy pattern layout 500 in the above-described manner, a first corrected dummy pattern layout 501, which is free of the dummy errors 550 such as jogs and notches, is created.

For example, a size-varied layout is created by, for example, applying "b5−1", which is smaller than the pattern spacing b5 in a direction perpendicular to the extension direction of the circuit pattern 301 by one unit dimension (for example, 1 nm when "nm" is applied as a unit dimension), to the X-axis spacing between the patterns of the dummy pattern layout 500 (FIG. 15) and original circuit layout 300. The created layout is then checked as to whether or not the pattern spacing is appropriate, using a method (e.g., a rule check) for checking pattern defects such as pattern bridge. Thereafter, defective areas expected to cause a bridge phenomenon are removed in accordance with a correction process. Thus, the first corrected dummy pattern layout 501 is created. The deduction of one unit dimension of 1 nm from the spacing of (e.g., 60 nm) may be analyzed as securing a bridge forbidden region where generation of a pattern bridge is forbidden. In accordance with the above-described procedure, dummy errors 550, which may be mainly jogs or notches, are removed.

Figure 17:
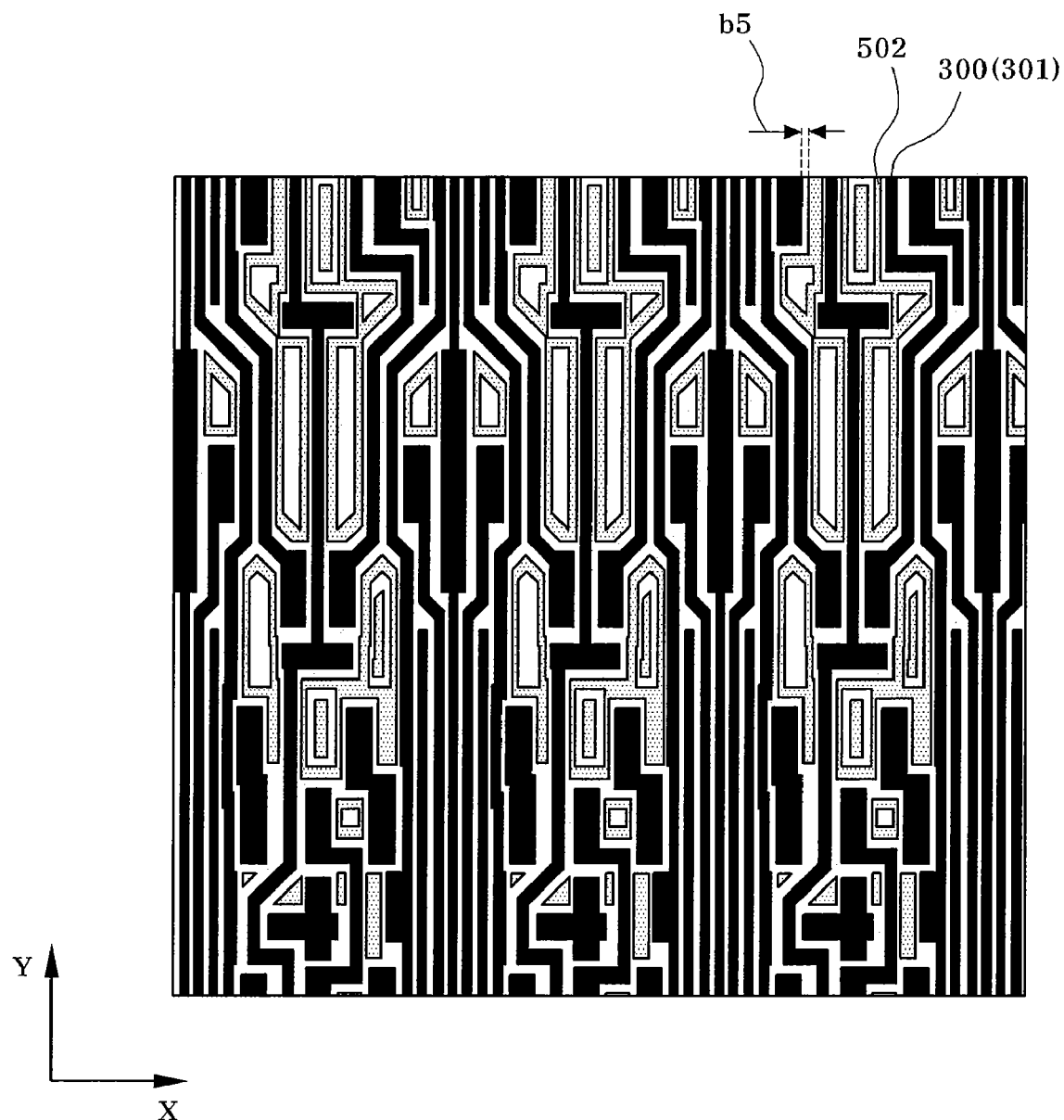

Referring to FIG. 17, a second corrected dummy pattern layout 502, which is free of jogs or the like, is created by adjusting the pattern spacing of the first corrected dummy pattern layout 501 such that the pattern spacing corresponds to the originally-set pattern spacing b5. It can be seen that the size of the first corrected dummy pattern layout 501 has been adjusted in accordance with the adjustment of the pattern spacing. The procedure for removing dummy errors such as jogs protruded in the X-axis direction may be further carried out under the condition in which the unit dimension deducted from the pattern spacing b5 is adjusted to have a larger value (e.g., 2 nm).

Figure 18:
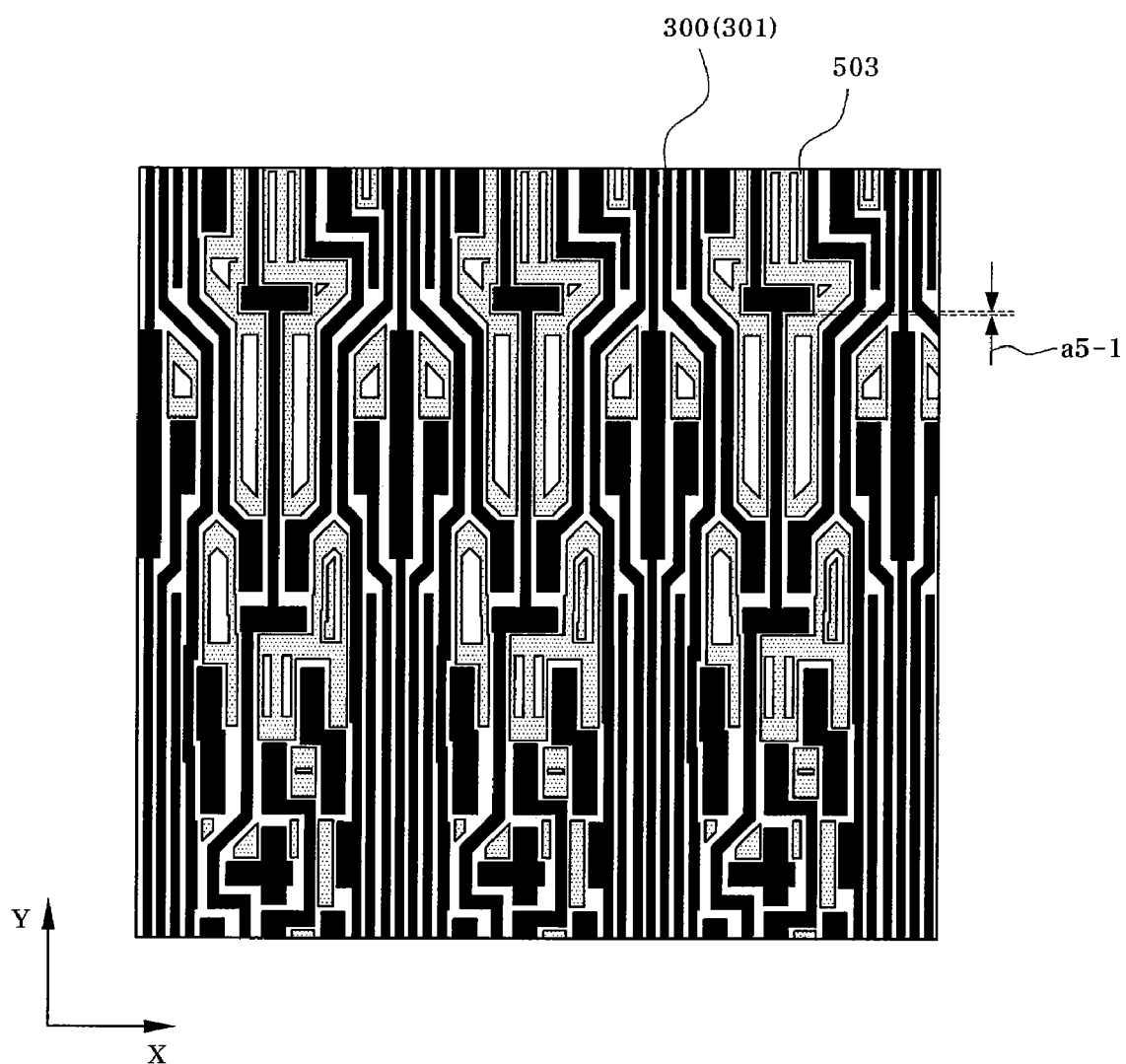

Referring to FIG. 18, a size-varied layout extended toward the top and bottom sides is created by growing the second corrected dummy pattern layout 502 in the Y-axis direction, namely, toward the top and bottom sides, that is, by applying "a1−1 nm" reduced from the Y-axis pattern spacing a5 by one unit dimension to the second corrected dummy pattern layout 502. The created layout is then checked as to whether or not the pattern spacing is appropriate, using a method (e.g., a rule check) for checking pattern defects such as pattern bridge. Thereafter, defective areas expected to cause a bridge phenomenon are removed in accordance with a correction process. Accordingly, a third corrected dummy pattern layout 503 is created. Thus, the third corrected dummy pattern layout 503 can be created free of dummy errors ("550" in FIG. 1) such as Y-axis jogs or notches.

Figure 19:
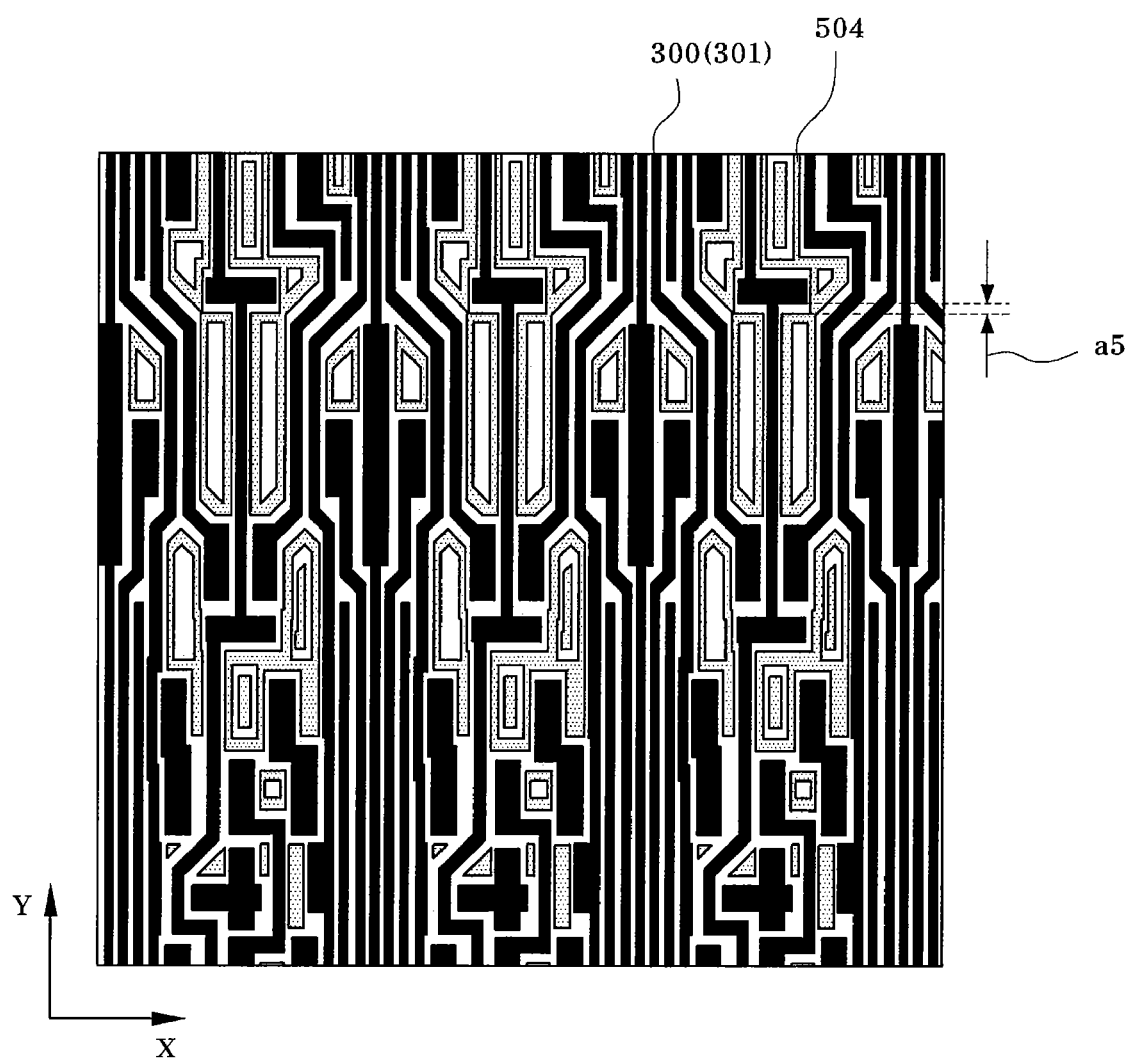

Referring to FIG. 19, the third corrected dummy pattern layout 503 is reduced by adjusting the pattern spacing of the third corrected dummy pattern layout 503 to be equal to the original spacing a5. As a result, a fourth corrected dummy pattern layout 504 is created free of jogs or the like. It can be seen that the third corrected dummy pattern layout 503 is adjusted in size in accordance with the adjustment of the pattern spacing of the fourth corrected dummy pattern layout 504. The procedure for removing dummy errors such as Y-axis jogs may be further repeated under the condition that the unit dimension deducted from the pattern spacing a5 is adjusted to have a larger value.

Figure 20:
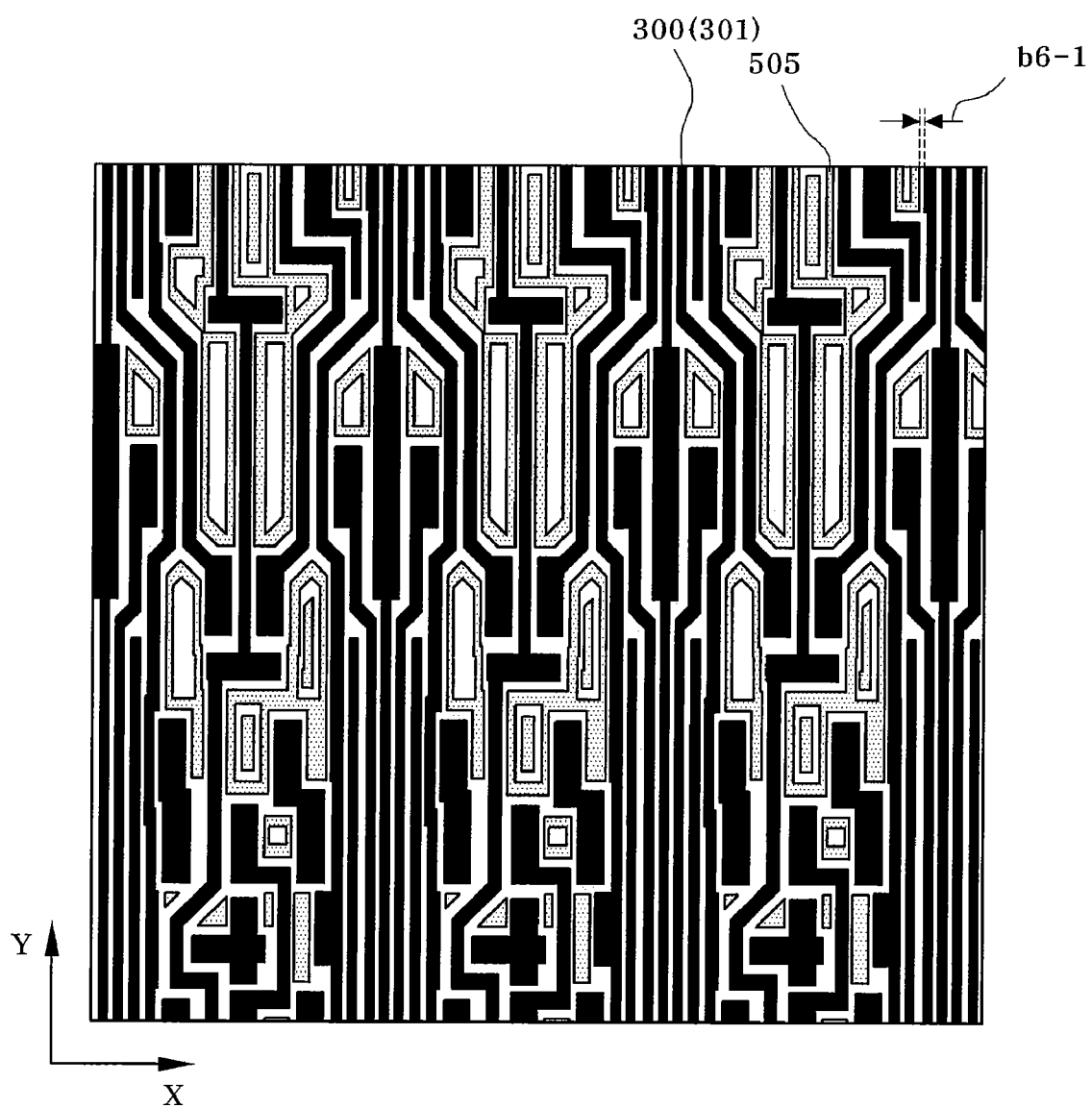
Figure 21:
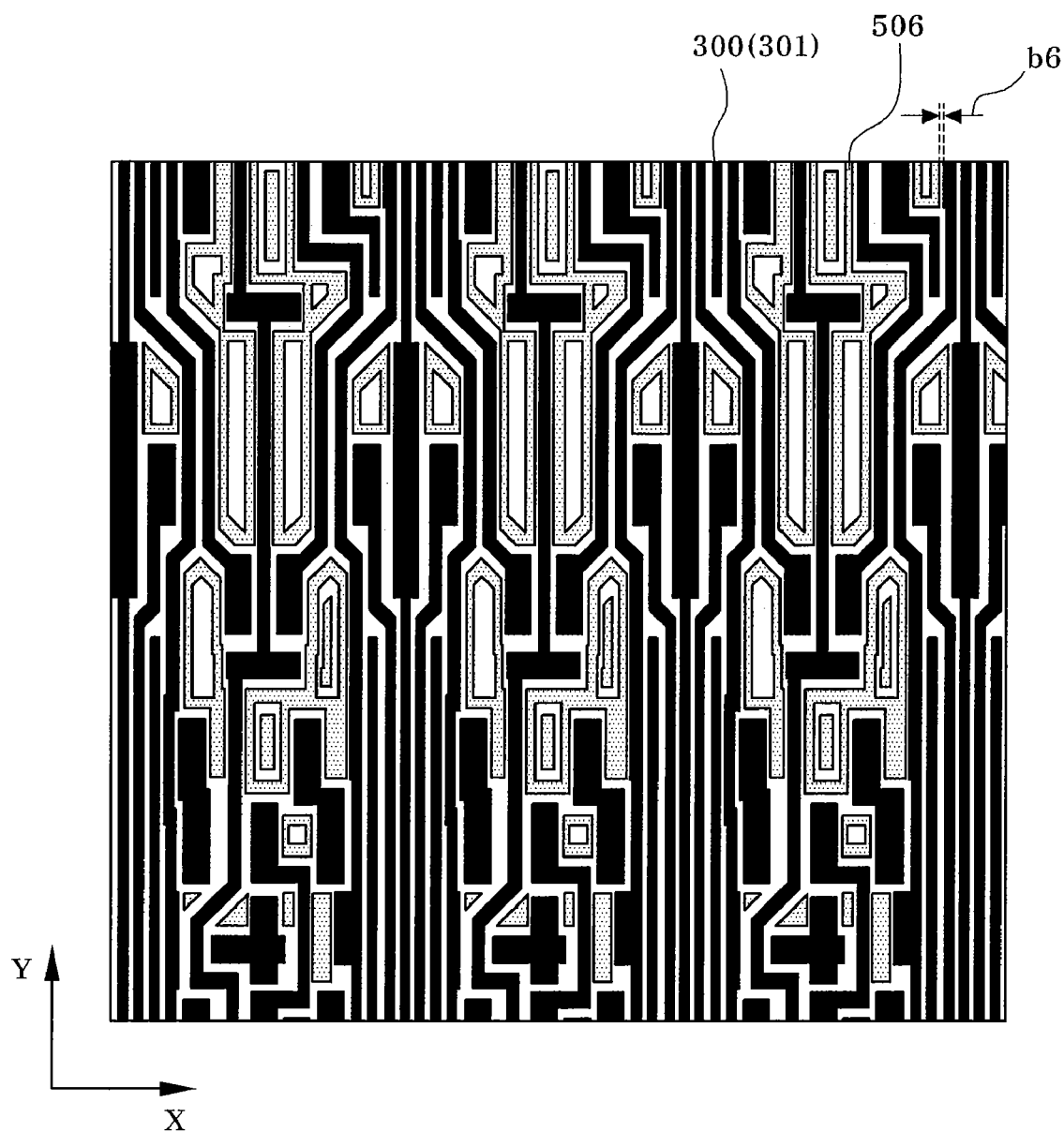

Referring to FIGS. 20 and 21, an additional procedure for removing secondary X-axis jogs from the fourth corrected dummy pattern layout 504 (FIG. 19) may be carried out as described with reference to FIGS. 16 and 17. In the illustrated embodiment, dummy errors such as jogs are additionally removed from the fourth corrected dummy pattern layout 504 (FIG. 19). For example, the dummy error removal is achieved by reducing the pattern spacing b6 by a given unit dimension in the X-axis direction, checking the reduced pattern spacing "b6−1" and pattern line width, using a rule check or the like, and removing checked portions expected to cause pattern bridge or the like.

Thereafter, a size-varied layout is created by adjusting the patterning spacing to be "b6−1" smaller than the pattern spacing b6 by one unit dimension. The created layout is then checked as to whether or not the pattern spacing is appropriate, using a method (e.g., a rule check) for checking pattern defects such as pattern bridge. Thereafter, defective portions expected to cause a bridge phenomenon are removed in accordance with a correction process. Accordingly, a fifth corrected dummy pattern layout 505 is created.

Referring to FIG. 21, the fifth corrected dummy pattern layout 505 is adjusted in pattern spacing such that the pattern spacing of the fifth corrected dummy pattern layout 505 is equal to the original spacing b6. As a result, a sixth corrected dummy pattern layout 506 free of jogs or the like is created. Since the sixth corrected dummy pattern layout 506 is free of jogs or the like, it may be used as a replacement for the dummy pattern layout 500 of FIG. 15. A final layout is then obtained by inserting the sixth corrected dummy pattern layout 506 into the original circuit layout 300 (step 170 of FIG. 1).

Before transferring the layout including the "final" dummy pattern layout 506 and the circuit layout 300 to an actual photomask substrate or to an actual wafer, a correction taking into consideration an optical proximity effect (OPE) generated during a light exposure process, for example, an OPE correction (OPC), may be carried out. The results of the OPC may be represented by an OPC-applied dummy pattern layout 590 and an OPC-applied circuit layout 390, as shown in FIG. 22.

Figure 22:
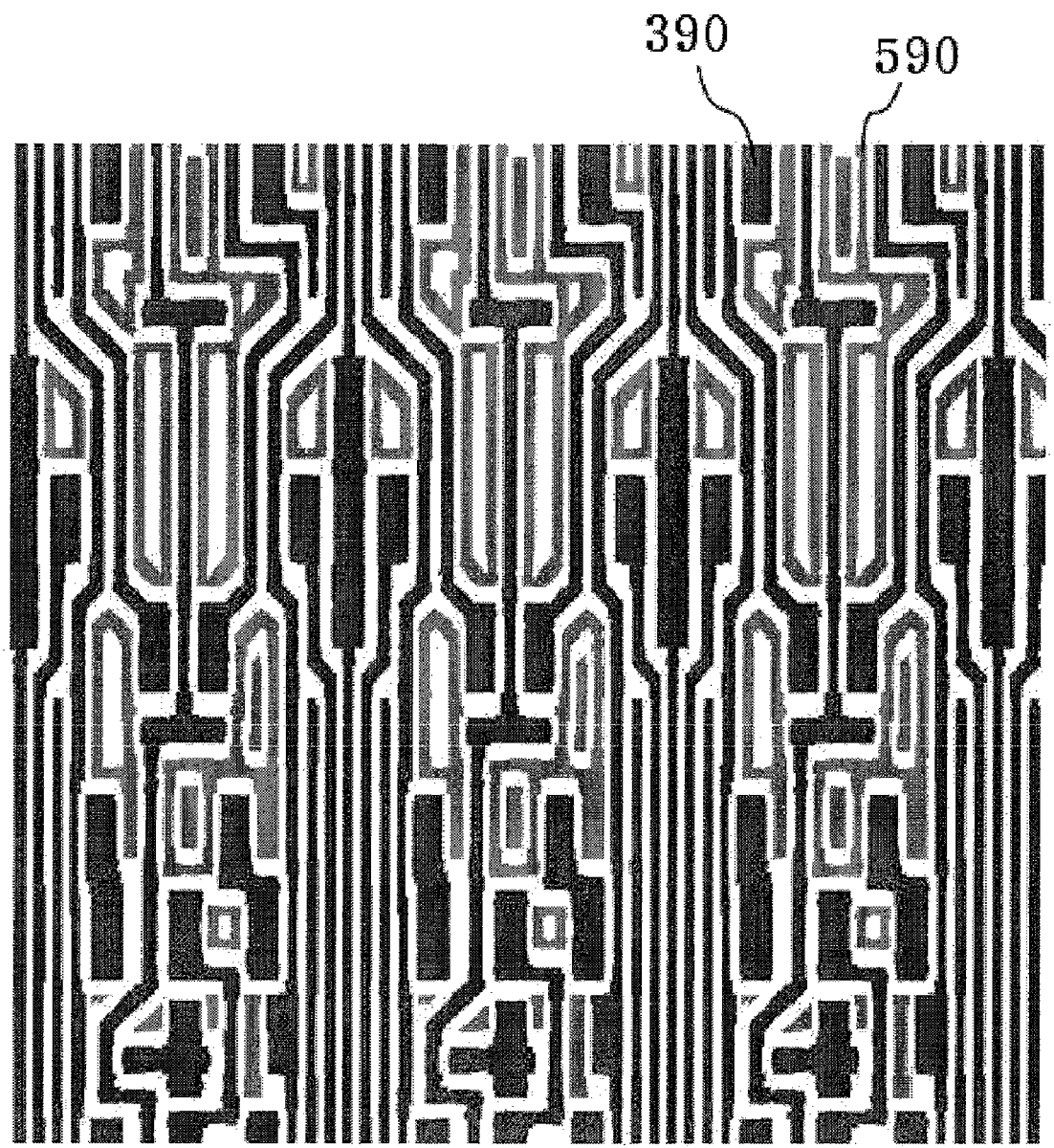
Figure 23:
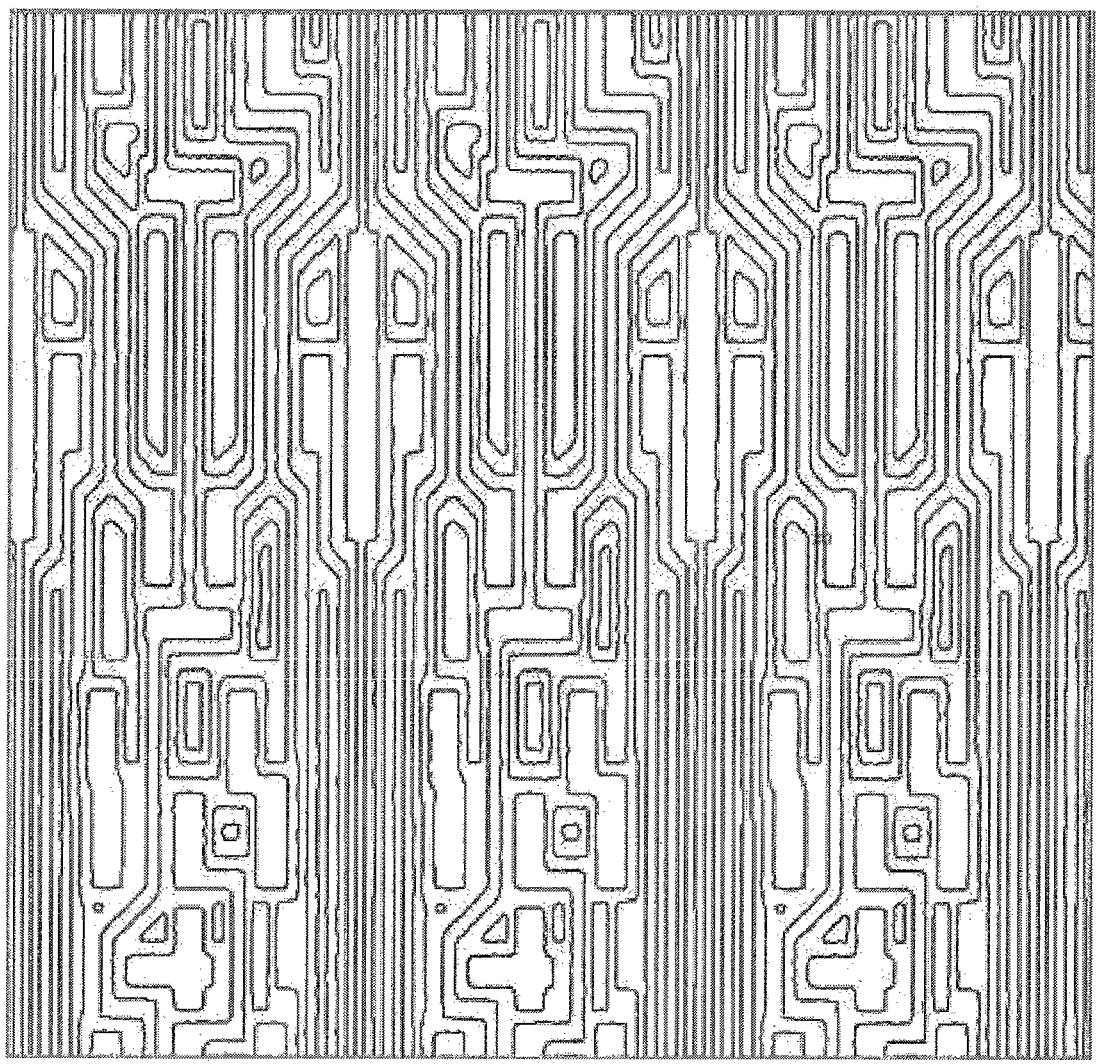
FIGS. 23 to 26 are layout views showing simulation results to explain the effects obtained by the semiconductor device fabrication method using the circuit layout having the self-assembled dummy pattern inserted in accordance with an embodiment of the present invention.
Figure 24:
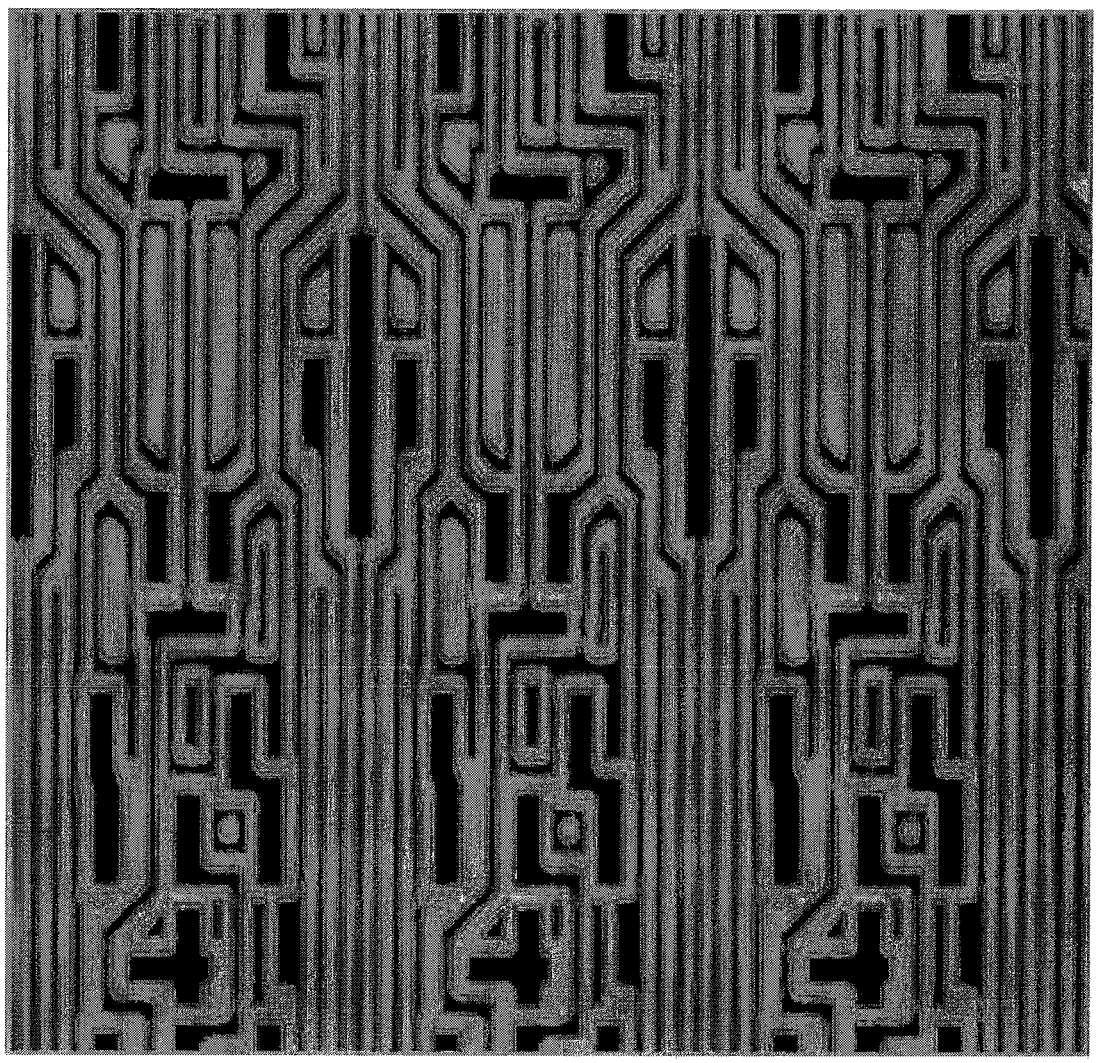
Figure 25:
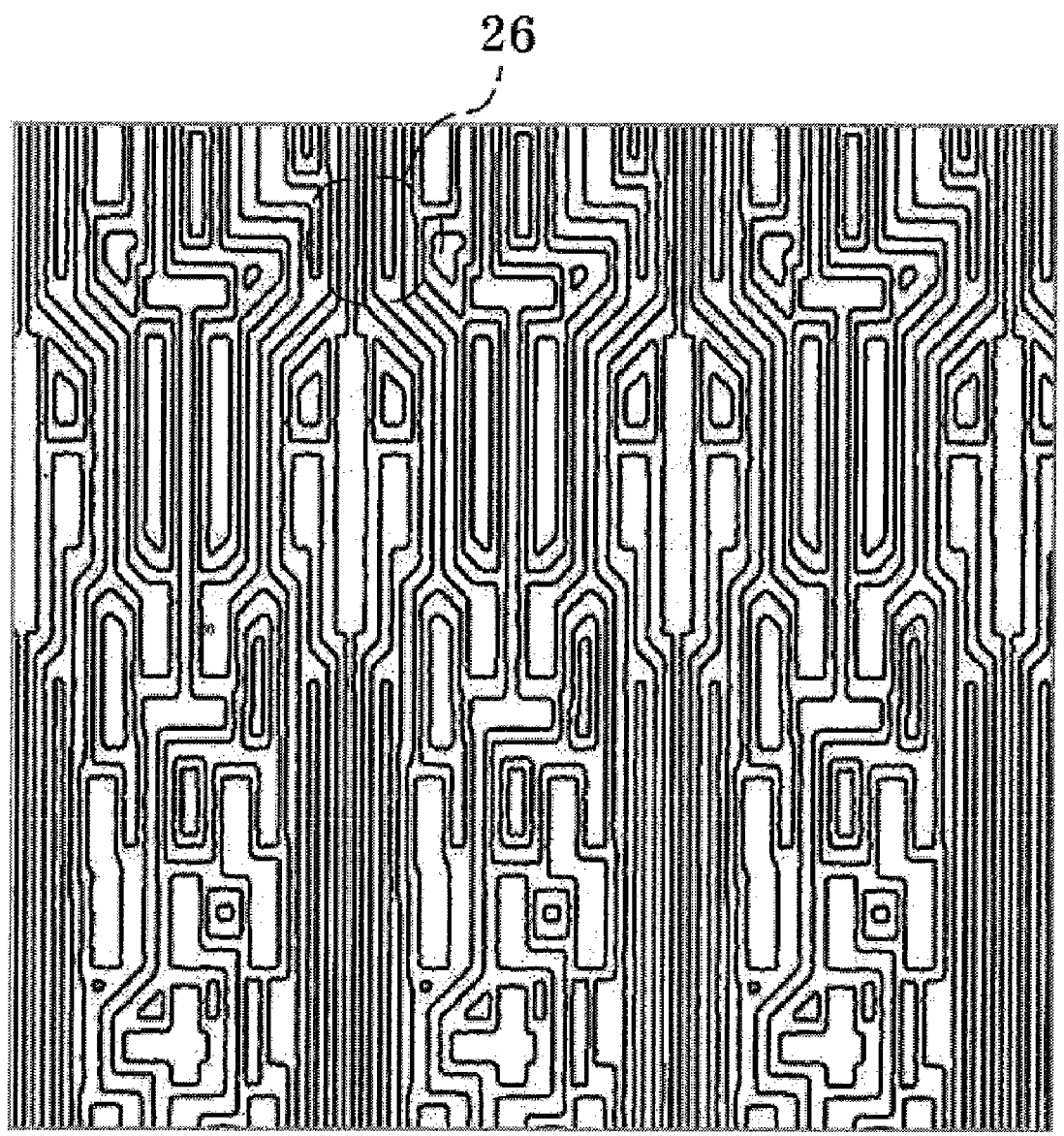
Figure 26:
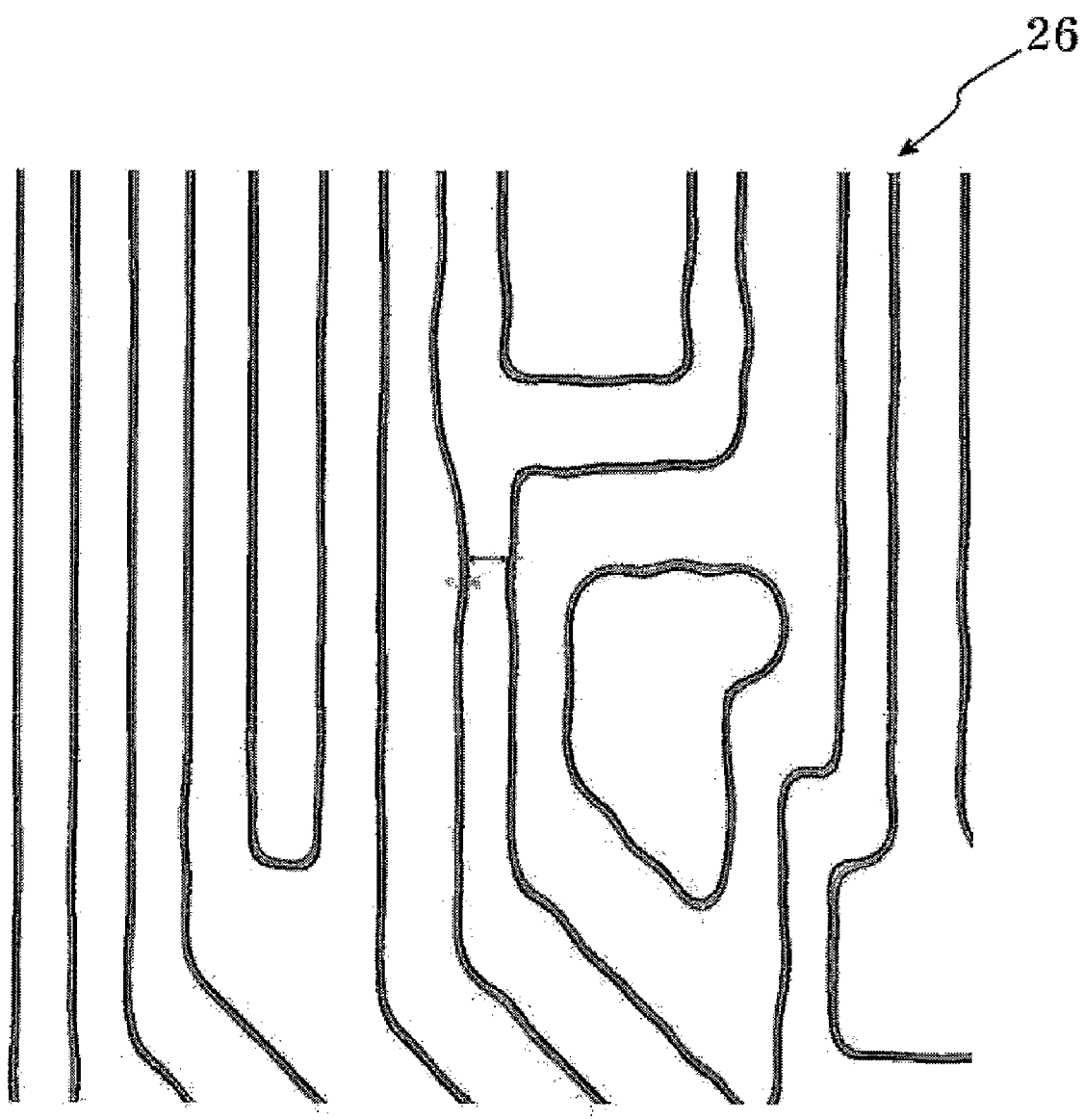

FIG. 23 depicts a contour plot drawn through a simulation carried out for data as to the OPC-applied layouts shown in FIG. 22, based on a model base approach scheme. FIG. 24 depicts an aerial map obtained through a simulation carried out for the OPC-applied layouts shown in FIG. 22. FIG. 25 is a contour plot where the energy of the exposure light is varied from a given exposure light energy condition by −10%/0%/10%. FIG. 26 depicts an enlarged contour plot corresponding to a portion 26 of FIG. 25.

The simulation results of FIGS. 23 to 26 demonstrate that the circuit pattern, into which the dummy pattern layout 590 (FIG. 22) created in accordance with the illustrated embodiment of the present invention is inserted, has a greatly increased process margin for a light exposure process. As shown by the results of FIGS. 23 and 24, pattern bridge and pattern necking is effectively eliminated. Referring to the results of FIG. 25, it can be seen that it is possible to suppress the occurrence of a bridge or necking phenomenon, in spite of a variation in exposure light energy. Accordingly, it is possible to obtain a larger light exposure process margin. Even when the focus margin according to a 60 nm design is varied in a range of about ±80 nm, improved results were obtained by the elimination of a bridge or necking phenomenon. Accordingly, an improvement in depth of focus can also be achieved.

Referring back to FIG. 1, the final layout including the OPC-applied dummy pattern layout 590 and the OPC-applied circuit layout 390, as shown in FIG. 22, is transferred to a photomask, to form a mask pattern (step 180 in FIG. 1). Thereafter, a light exposure process using the photomask is carried out to transfer the final layout to a wafer (step 190 in FIG. 1). In this case, it is possible to achieve an improvement in the process margin for the pattern exposure process because the light exposure conditions used in the light exposure process, for example, the dipole illumination system conditions, have been taken into consideration upon insertion of the dummy pattern.

Where a dipole illumination system is used, a difference between an X-axis resolution and a Y-axis resolution may be involved. To this end, upon creating the dummy pattern layout 390 (FIG. 22), different insertion conditions are applied in the X-axis and Y-axis directions, taking into consideration the resolution difference. Where an illumination system different from the dipole illumination system in terms of illumination directions, for example, a quadupole illumination system, is used, reflection of light exposure conditions can be achieved by changing the direction of the reference axis.

Although the embodiment of the present invention has been described using specific examples, it can also be used for other layouts. The present invention is also applicable to a layout for metal connecting lines other than bit lines. In addition, the present invention can be applied not only to a flash memory device, but also to a DRAM memory device.

Also, the present invention can be applied to a layout implemented on a photomask used in a light exposure process. For example, the layout according to an embodiment of the present invention is applicable to a phase shift mask or a binary mask. The layout according to an embodiment of the present invention is also applicable to a maskless lithography process in which a pattern is directly transferred to a wafer. In addition, the layout according to an embodiment of the present invention can be applied to a process for forming a CMP dummy or a gate assist dummy other than circuit lines such as bit lines.

Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for transferring patterns to a substrate, comprising:
   designing a circuit layout to be transferred to the substrate;
   setting light exposure conditions to be used for transfer of the circuit layout;
   obtaining an inverse layout of the circuit layout, the inverse layout having a pattern size;
   obtaining a first reduced layout by reducing the pattern size of the inverse layout a first amount;
   obtaining a second reduced layout by reducing the pattern size of the inverse layout a second amount which is greater than the first amount;
   obtaining a dummy pattern layout by deducting the second reduced layout from the first reduced layout;
   obtaining a combined layout by combining the dummy pattern layout and the circuit layout; and
   transferring the combined layout to the substrate.

2. The method according to claim 1, wherein the circuit layout is designed as a layout of metal lines of a memory device, wherein the substrate is a semiconductor substrate.

3. The method according to claim 1, wherein the circuit layout is designed as a layout of bit lines constituting a page buffer circuit of a flash memory device.

4. The method according to claim 1, wherein the circuit layout is designed as an arrangement layout of connecting contacts for a line connecting structure.

5. The method according to claim 1, further comprising:
   obtaining a third reduced layout by reducing the pattern size of the inverse layout a third amount which is greater than the second amount;
   obtaining a fourth reduced layout by reducing the pattern size of the inverse layout a fourth amount which is greater than the third amount;
   obtaining a second dummy pattern layout by deducting the fourth reduced layout from the third reduced layout; and
   obtaining a second combined layout by combining the second dummy pattern layout and the circuitry layout; and
   transferring the second combined layout to the substrate.

6. The method according to claim 1, wherein transferring the combined layout to the substrate includes:
   transferring the combined layout to a photomask substrate, thereby forming a photomask; and
   performing a light exposure process using the photomask, thereby transferring the combined layout to the substrate.

7. The method according to claim 6, wherein the light exposure process is performed under light exposure conditions including a symmetrical illumination or an asymmetric illumination.

8. The method according to claim 6, wherein the photomask comprises a binary mask or a phase shift mask.

* * * * *